United States Patent
Matsumoto et al.

(10) Patent No.: US 10,665,434 B2
(45) Date of Patent: May 26, 2020

(54) SLIP RING, SUPPORT MECHANISM, AND PLASMA PROCESSING APPARATUS

(71) Applicant: TOKYO ELECTRON LIMITED, Tokyo (JP)

(72) Inventors: Kazuya Matsumoto, Miyagi (JP); Takashi Yamamoto, Kai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 136 days.

(21) Appl. No.: 15/558,126

(22) PCT Filed: Apr. 7, 2016

(86) PCT No.: PCT/JP2016/061338
§ 371 (c)(1),
(2) Date: Sep. 13, 2017

(87) PCT Pub. No.: WO2016/170989
PCT Pub. Date: Oct. 27, 2016

(65) Prior Publication Data
US 2018/0047547 A1    Feb. 15, 2018

(30) Foreign Application Priority Data
Apr. 20, 2015 (JP) .................................. 2015-085881

(51) Int. Cl.
*H01J 37/32* (2006.01)
*H01L 21/683* (2006.01)
(Continued)

(52) U.S. Cl.
CPC ...... *H01J 37/32715* (2013.01); *H01J 37/321* (2013.01); *H01J 37/3211* (2013.01);
(Continued)

(58) Field of Classification Search
CPC ............. H01L 21/3065; H01L 21/6833; H01L 21/67069; H01L 21/683; H01L 43/12;
(Continued)

(56) References Cited

U.S. PATENT DOCUMENTS 3,087,038 A * 4/1963 Bethke ................. H01H 1/5833
200/237
5,688,331 A * 11/1997 Aruga ............... C23C 16/45521
118/725
(Continued)

FOREIGN PATENT DOCUMENTS

CN    101192557 A    6/2008
CN    101682137 A    3/2010
(Continued)

OTHER PUBLICATIONS

International Search Report dated Jun. 21, 2016 in PCT/JP2016/061338.

*Primary Examiner* — Yuechuan Yu
(74) *Attorney, Agent, or Firm* — Rothwell, Figg, Ernst & Manbeck, P.C.

(57) ABSTRACT

Disclosed is a slip ring including: a conductive rotor that is rotatable around a rotation axis; a conductive stator provided coaxially with the rotor; a conductive sphere disposed between the rotor and the stator to form an electric path between the rotor and the stator; and a conductive coil spring provided between the sphere and one of the rotor and the stator and extending in a circumferential direction with respect to the rotation axis to be in contact with the sphere and one of the rotor and the stator.

15 Claims, 20 Drawing Sheets

(51) Int. Cl.
*H01L 21/3065* (2006.01)
*H01L 21/67* (2006.01)
*H01R 39/28* (2006.01)
*H01R 39/38* (2006.01)
*H01L 43/12* (2006.01)

(52) U.S. Cl.
CPC .... *H01J 37/3244* (2013.01); *H01J 37/32724* (2013.01); *H01J 37/32733* (2013.01); *H01J 37/32816* (2013.01); *H01J 37/32834* (2013.01); *H01L 21/3065* (2013.01); *H01L 21/67069* (2013.01); *H01L 21/683* (2013.01); *H01L 21/6833* (2013.01); *H01R 39/28* (2013.01); *H01R 39/381* (2013.01); *H01J 2237/334* (2013.01); *H01L 43/12* (2013.01)

(58) Field of Classification Search
CPC ............ H01J 37/32834; H01J 37/3244; H01J 37/32724; H01J 37/32715; H01J 37/321; H01J 37/3211; H01J 37/32733; H01J 37/32816; H01J 2237/334; H01R 39/28; H01R 39/381
See application file for complete search history.

(56) References Cited

U.S. PATENT DOCUMENTS

| | | | |
|---|---|---|---|
| 2006/0180968 A1* | 8/2006 | Kim | ........... H01L 21/68785 269/51 |
| 2008/0258411 A1* | 10/2008 | Miura | ........... C23C 14/505 279/128 |
| 2011/0031216 A1* | 2/2011 | Liao | ........... H01J 37/32082 216/67 |

FOREIGN PATENT DOCUMENTS

| | | | | |
|---|---|---|---|---|
| JP | 55099332 A | * | 7/1980 | ............ B01J 3/002 |
| JP | 59-132111 U | | 9/1984 | |
| JP | 1-117317 | | 5/1989 | |
| JP | 2-29161 U | | 2/1990 | |
| JP | 5-47432 A | | 2/1993 | |
| JP | 9-186141 A | | 7/1997 | |
| JP | 10-143791 | | 5/1998 | |
| JP | 10261698 A | * | 9/1998 | ......... H01L 21/6831 |
| JP | 11-214108 A | | 8/1999 | |
| JP | 2009-225578 | | 10/2009 | |
| JP | 2010-147003 A | | 7/2010 | |
| JP | 2010-165472 A | | 7/2010 | |
| WO | 2009/128134 A1 | | 10/2009 | |

* cited by examiner

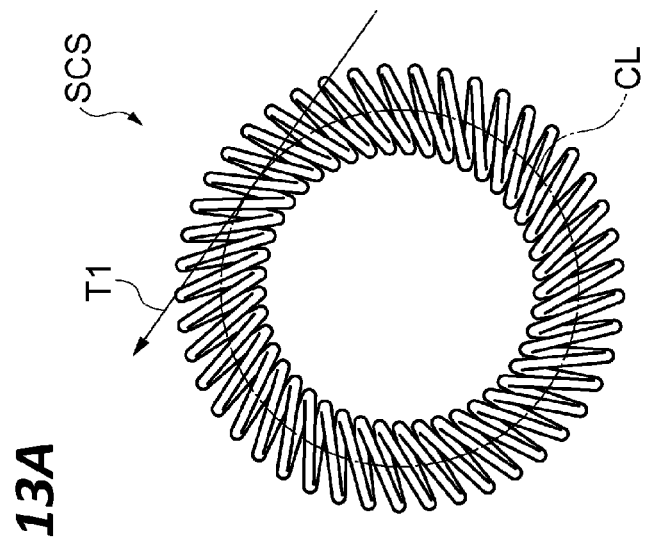
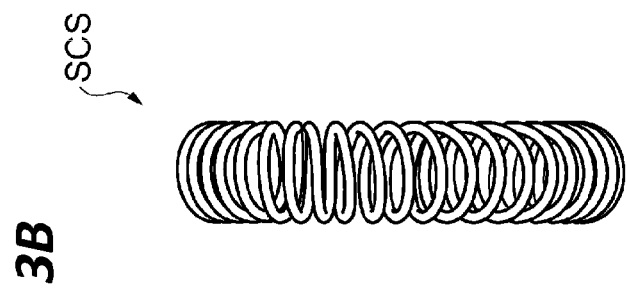
FIG. 13A
FIG. 13B

SLIP RING, SUPPORT MECHANISM, AND PLASMA PROCESSING APPARATUS

CROSS REFERENCE TO RELATED APPLICATION

This application is a 35 U.S.C. 371 National Phase Entry Application from PCT/JP2016/061338, filed Apr. 7, 2016, which claims priority to Japanese Patent Application No. 2015-085881, filed Apr. 20, 2015, the disclosures of which are incorporated herein in their entirety by reference.

TECHNICAL FIELD

The present disclosure relates to a slip ring, a support mechanism, and a plasma processing apparatus.

BACKGROUND

In the manufacture of electronic devices, a plasma processing apparatus is widely used for etching a workpiece. For example, the plasma processing apparatus is also used for etching a magnetic layer included in a magnetic random access memory (MRAM). In general, the plasma processing apparatus includes a processing container in which a plasma processing is performed. A stage is provided within the processing container.

The stage generally includes an electrostatic chuck and a lower electrode. The electrostatic chuck includes an electrode film surrounded by a dielectric and generates an electrostatic force when a voltage is applied to the electrode film. By this electrostatic force, the electrostatic chuck attracts and holds the workpiece. In addition, a high frequency bias for drawing ions into the workpiece is supplied to the lower electrode.

As a type of such a stage, there is a rotary stage configured to be rotatable in order to improve the uniformity of the plasma processing on a workpiece. In the rotary stage, a slip ring is used to apply a voltage to the electrode film of the electrostatic chuck and to supply a high frequency bias to the lower electrode. Such a plasma processing apparatus including a rotary stage is described in, for example, Japanese Patent Laid-Open Publication No. 01-117317.

In addition, there are two types of slip rings: a non-contact type slip ring and a contact type slip ring. In the non-contact type slip ring, as described in Japanese Patent Laid-Open Publication No. 10-143791, a medium having an electrical conductivity is filled between a stator and a rotor. For such a medium, for example, mercury is used. Further, in the contact type slip ring, a brush is provided between a stator and a rotor to electrically connect the stator and the rotor. Slip rings using a brush are described in, for example, Japanese Patent Laid-Open Publication Nos. 2009-225578 and 11-214108.

PRIOR ART DOCUMENT

Patent Document

Patent Document 1: Japanese Patent Laid-Open Publication No. 01-117317
Patent Document 2: Japanese Patent Laid-Open Publication No. 10-143791
Patent Document 3: Japanese Patent Laid-Open Publication No. 2009-225578
Patent Document 4: Japanese Patent Laid-Open Publication No. 11-214108

DISCLOSURE OF THE INVENTION

Problems to be Solved

In the non-contact type slip ring, mercury used as a medium is toxic to the human body, and a seal structure is necessary for sealing the mercury. Thus, the slip ring becomes large. Further, the sealing structure may be damaged by long-term use, thereby causing leakage of mercury, which may seriously affect the external environment.

In the contact type slip ring, the above-mentioned problem of the non-contact type slip ring may be avoided. However, the contact resistance is increased because the rotor and the stator are electrically connected by point contact of the brush. Against this background, it is demanded to reduce the contact resistance in the contact type slip ring.

Means to Solve the Problems

In an aspect, a slip ring is provided. The slip ring includes a rotor, stator, sphere, and a coil spring. The rotor is conductive and is rotatable around a rotation axis. The stator is conductive and is provided coaxially with the rotor. The sphere is conductive and is disposed between the rotor and the stator. The sphere forms an electric path between the rotor and the stator. The coil spring is conductive, is provided between the sphere and one of the rotor and the stator, and extends in a circumferential direction with respect to the rotation axis. The coil spring comes in contact with the sphere and one of the rotor and the stator.

In the slip ring, the conductive coil spring is provided between the sphere and one of the rotor and the stator, and the coil spring comes in contact with the sphere and one of the rotor and the stator at a plurality of points. Therefore, the contact resistance between the sphere and one of the rotor and the stator is reduced, so that the contact resistance of the slip ring is reduced.

In an exemplary embodiment, the slip ring may further include a second conductive coil spring. In the exemplary embodiment, the second coil spring is provided between the sphere and a remaining one of the rotor and the stator and extends in a circumferential direction with respect to the rotation axis to be in contact with the sphere and the remaining one of the rotor and the stator. In the exemplary embodiment, the coil spring comes in contact with the sphere and one of the rotor and the stator at a plurality of points. Therefore, the contact resistance between the sphere and the other of the rotor and the stator is reduced. Thus, the contact resistance of the slip ring is further reduced.

In an exemplary embodiment, the coil spring and the second coil spring may be arranged in a direction in which the rotation axis extends. According to the exemplary embodiment, the distances of the coil springs and the other coil springs, that is, the two coil springs from the rotation axis are equal. Therefore, the difference between the slip amount between the sphere and one of the two coil springs and the slip amount between the sphere and the other of the two coil springs becomes small, so that the abrasion caused by sliding of the two coil springs and the sphere is reduced. As a result, the life of the slip ring is prolonged. In another exemplary embodiment, the coil spring and the second coil spring may be arranged in a radial direction with respect to the rotation axis.

In an exemplary embodiment, the coil spring may be an obliquely wound spring. The reaction force generated by the obliquely wound spring against the sphere is smaller than the reaction force generated by a general coil spring. Therefore, the contact area between the coil spring and the sphere is increased, and the contact resistance is further reduced. In addition, the contact resistance is stabilized.

In an exemplary embodiment, both the coil spring and the second coil spring may be obliquely wound springs. The contact area between the coil spring and the sphere and the contact area between the second coil spring and the sphere are increased, and the contact resistance is further reduced. In addition, the contact resistance is stabilized.

In another aspect, a support mechanism is provided to support a workpiece in a processing container of a plasma processing apparatus. The support mechanism includes a holding part, a driving device, and a rotary connector. The holding part holds the workpiece and is rotatable around a first axis. The driving device rotates the holding part. The rotary connector has a plurality of slip rings. The plurality of slip rings are the slip rings of one of the above-described aspect and various exemplary embodiments, and are provided such that a rotation axis thereof coincides with the first axis. The holding part includes a lower electrode, an electrostatic chuck, and a plurality of conductors. The electrostatic chuck is provided on the lower electrode. The plurality of conductors are coaxially provided such that center axes thereof coincide with the first axis. The plurality of conductors include a first conductor connected to an electrode film of the electrostatic chuck and a second conductor connected to the lower electrode. Among the plurality of slip rings, a first slip ring is electrically connected to the first conductor and a second slip ring is electrically connected to the second conductor.

Since the support mechanism has the rotary connector that adopts the slip rings of one of the above-described aspect and various embodiments, the contact resistance in the electrical path to the electrode film of the electrostatic chuck and the lower electrode is reduced. Therefore, it is possible to apply a large voltage to the electrode film of the electrostatic chuck, and to apply a large bias to the lower electrode.

In an exemplary embodiment, the support mechanism may further include a container part, a tilting shaft part, and a second driving device. The container part defines a sealed space together with the holding part. The tilting shaft part has a hollow shape that extends along a second axis orthogonal to the first axis, and is coupled to the container part. The second driving device rotates the tilting shaft part around the second axis. The plurality of conductors, the driving device that rotates the holding part, and the rotary connector are provided in the space defined by the container part and the holding part. The support mechanism of the exemplary embodiment may tilt and rotate the holding part, and may provide an electrical path with less contact resistance to the electrode film of the electrostatic chuck and the lower electrode of the holding part. In addition, since the plurality of conductors, the holding part, and the rotary connector are provided in the space defined by the container part and the holding part, it is possible to protect the plurality of conductors, the holding portion, and the rotary connector in the space separated from a space for the plasma processing in the case where the support mechanism is used in the plasma processing apparatus.

In yet another aspect, a plasma processing apparatus is provided to perform a plasma processing on a workpiece. The plasma processing apparatus includes a processing container, a gas supply system, a plasma source, a support mechanism, an exhaust system, a DC power source, and a bias power supply unit. The gas supply system supplies a gas into the processing container. The plasma source excites the gas supplied into the processing container. The support mechanism is the support mechanism of one of the above-described aspect and exemplary embodiments, and holds the workpiece in the processing container by a holding part. The exhaust system is provided to exhaust a space in the processing container. The DC power source is provided outside the processing container and generates a voltage to be applied to the electrode film of the electrode chuck. The bias power supply unit is provided outside the processing container and generates a bias to be applied to a lower electrode. The DC power source is connected to a first slip ring via a first wire, and the bias power supply unit is connected to a second slip ring via a second wire.

In the plasma processing apparatus according to this aspect, a power is stably supplied to the electrostatic chuck and the lower electrode via the first wire and the second wire connected to the first slip ring and the second slip ring, respectively.

In an exemplary embodiment, the holding part and the container part may be provided within the processing container, the tilting shaft part may be provided to extend from an inside of the processing container to an outside of the processing container, the first wire may pass through the tilting shaft part and connect the DC power source and the first slip ring to each other, and the second wire may pass through the tilting shaft part and connect the bias power supply unit and the second slip ring to each other. According to the exemplary embodiment, the first wire and the second wire may be connected to the rotary connector without being exposed to the plasma. In addition, according to the plasma processing apparatus, it is possible to perform a plasma processing on the workpiece while rotating the workpiece in a tilted state.

In an exemplary embodiment, the holding part may further include a heater, the plurality of conductor may further include third and fourth conductors that are connected to the heater, the plurality of slip rings may further include a third slip ring connected to the third conductor and a fourth slip ring connected to the fourth conductor, the plasma processing apparatus may further include a heater power source that is provided outside the processing container and supplies a power to the heater, and the heater power source may be electrically connected to the third slip ring and the fourth slip ring via third and fourth wires that pass through an inside of the tilting shaft part, respectively.

In an exemplary embodiment, the support mechanism may further include a temperature sensor provided in the holding part, the plurality of conductors may further include a fifth conductor connected to the temperature sensor, the plurality of slip rings may further include a fifth slip ring connected to the fifth conductor, the plasma processing apparatus may further include a controller, and the controller may be electrically connected to the fifth slip ring via a fifth wire that passes through the tilting shaft part.

In an exemplary embodiment, the bias power supply unit may supply a pulse-modulated DC voltage to the lower electrode. According to the exemplary embodiment, ions of a relatively low energy and a narrow energy band may be drawn into the workpiece. Therefore, it is possible to selectively etch a region formed of a specific substance in the workpiece. Further, in an exemplary embodiment, the bias power supply unit may selectively supply the pulse-modulated DC voltage and a high-frequency bias to the lower electrode.

Effect of the Invention

As described above, it is possible to reduce the contact resistance in the contact type slip ring.

BRIEF DESCRIPTION OF THE DRAWINGS

FIGS. 13A and 13B are schematic views illustrating an obliquely wound spring which is an example of the coil spring according to an exemplary embodiment.

DETAILED DESCRIPTION TO EXECUTE THE INVENTION

Hereinafter, various exemplary embodiments will be described in detail with reference to the drawings. In addition, in the respective drawings, the same or corresponding parts will be denoted by the same symbols.

Figure 1:
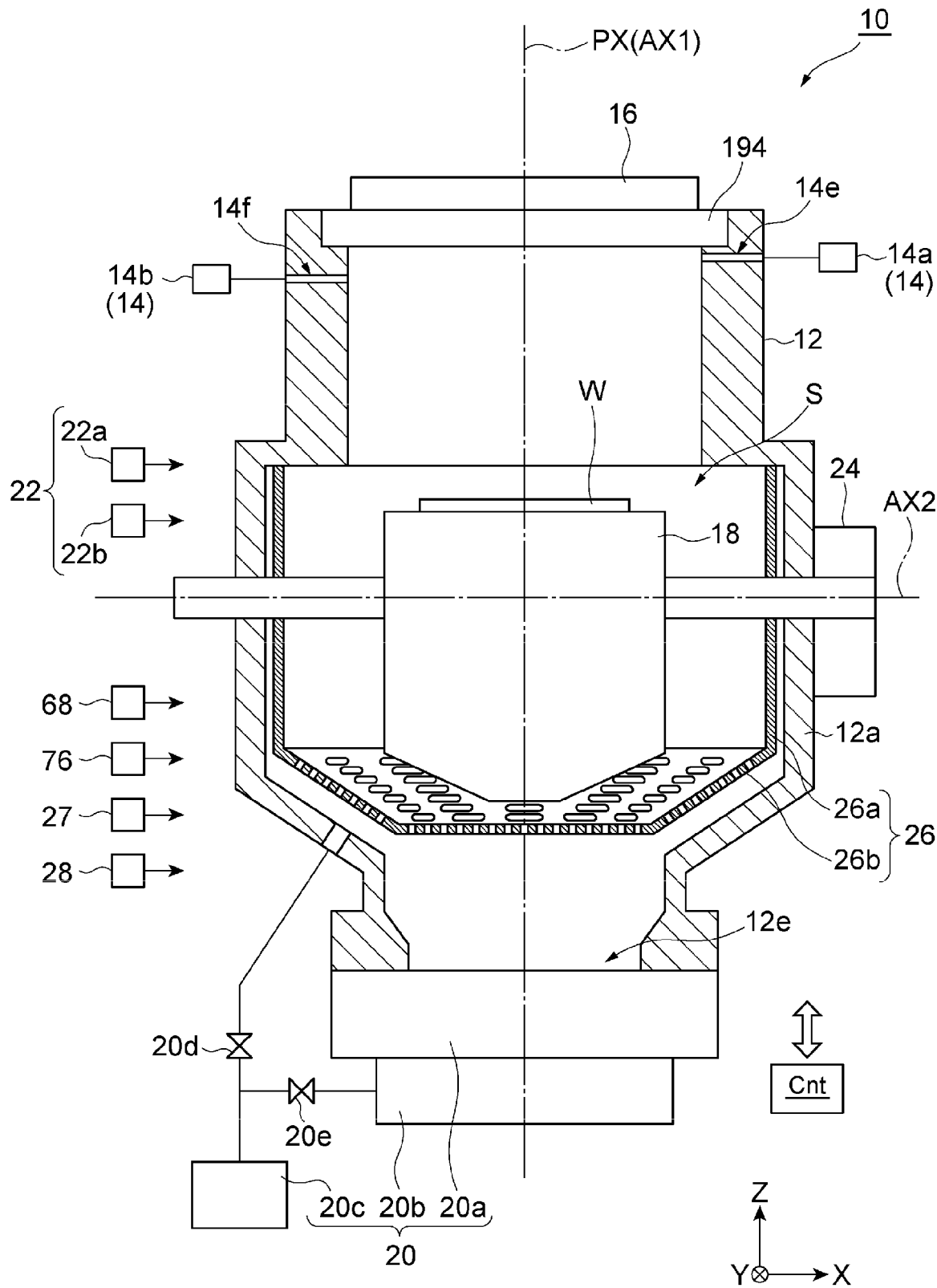
FIG. 1 is a view schematically illustrating a plasma processing apparatus according to an exemplary embodiment.
Figure 2:
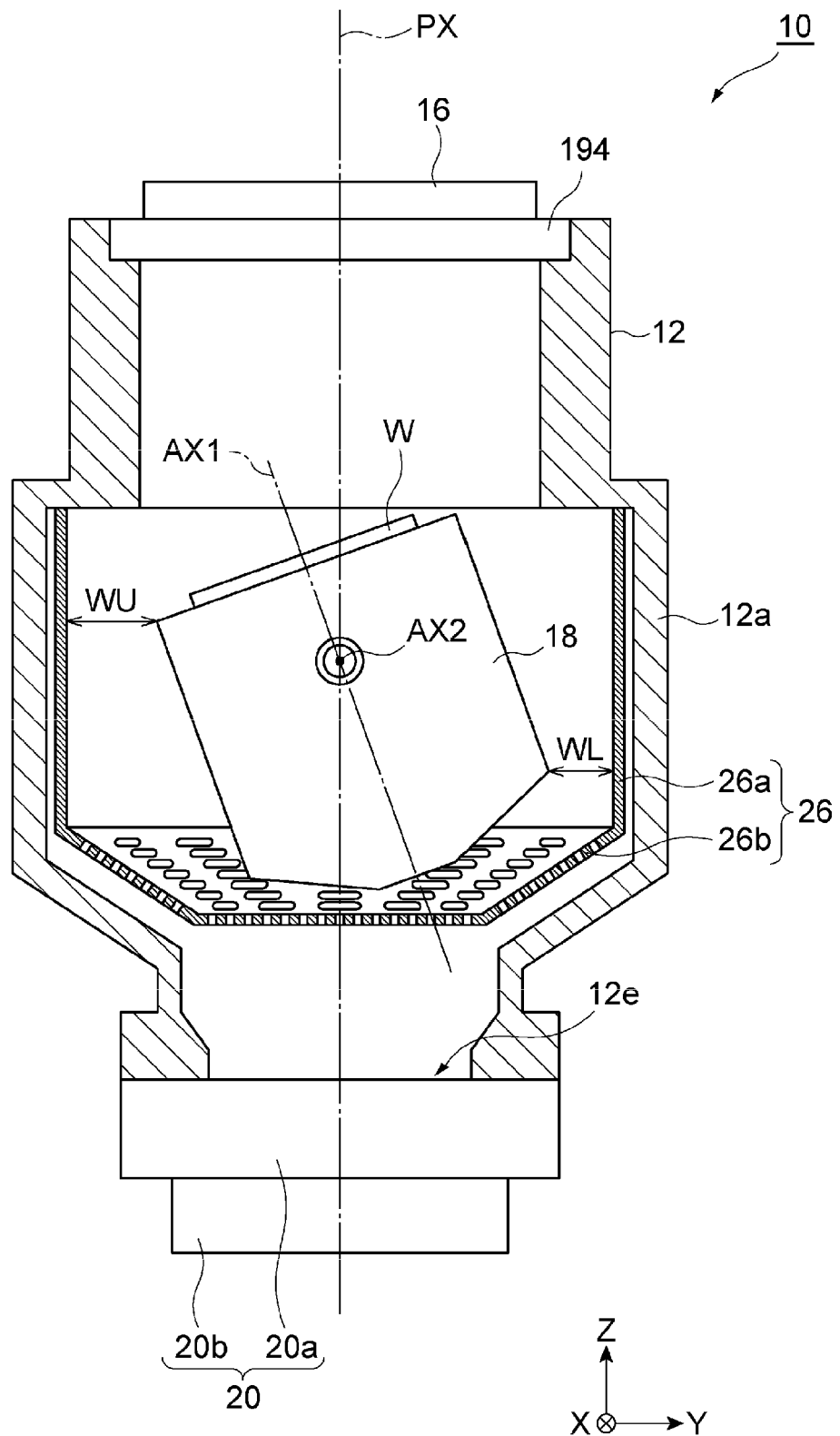
FIG. 2 is a view schematically illustrating a plasma processing apparatus according to an exemplary embodiment.

FIGS. 1 and 2 are views schematically illustrating a plasma processing apparatus according to an exemplary embodiment, in which a processing container is broken in a plane including an axis PX extending in the vertical direction. FIG. 1 illustrates a plasma processing apparatus in a state where a support mechanism (to be described later) is not tilted, and FIG. 2 illustrates a plasma processing apparatus in a state where the support mechanism is tilted.

The plasma processing apparatus 10 illustrated in FIGS. 1 and 2 includes a processing container 12, a gas supply system 14, a plasma source 16, a support mechanism 18, an exhaust system 20, a bias power supply unit 22, a DC power source 27, a heater power source 28, and a controller Cnt. The processing container 12 has a substantially cylindrical shape. In an exemplary embodiment, the central axis of the processing container 12 coincides with the axis PX. The processing container 12 provides a space6 S for a plasma processing on a workpiece (hereinafter, referred to as a "wafer W" in some cases).

In an exemplary embodiment, the processing container 12 has a substantially constant width in an intermediate portion 12a in its height direction, that is, in a portion where the support mechanism 18 is accommodated. In addition, the processing container 12 is tapered such that the width thereof gradually decreases from the lower end of the intermediate portion to the bottom portion. In addition, the bottom portion of the processing container 12 provides an exhaust port 12e. The exhaust port 12e is axially symmetric with respect to the axis PX.

The gas supply system 14 is configured to supply a gas into the processing container 12. The gas supply system 14 includes a first gas supply unit 14a and a second gas supply unit 14b. The first gas supply unit 14a is configured to supply a first processing gas into the processing container 12. The second gas supply unit 14b is configured to supply a second processing gas into the processing container 12. The details of the gas supply system 14 will be described later.

The plasma source 16 is configured to excite the gas supplied into the processing container. In an exemplary embodiment, the plasma source 16 is provided on the top portion of the processing container 12. In addition, in an exemplary embodiment, the central axis of the plasma source 16 coincides with the axis PX. The details of an example of the plasma source 16 will be described later.

The support mechanism 18 is configured to hold the wafer W in the processing container 12. The support mechanism 18 is configured to rotate the wafer W around a first axis AX1. In addition, the support mechanism 18 is configured to be rotatable around a second axis AX2 orthogonal to the axis PX and the first axis AX1. The support mechanism 18 may be tilted with respect to the axis PX by the rotation around the second axis AX2. In order to tilt the supporting mechanism 18, the plasma processing apparatus 10 includes a driving device 24. The driving device 24 is provided outside the processing container 12, and generates a driving force to rotate the support mechanism 18 around the second axis AX2. When the support mechanism 18 is not tilted, the first axis AX1 coincides with the axis PX as illustrated in FIG. 1. Meanwhile, when the support mechanism 18 is tilted, the first axis AX1 is tilted with respect to the axis PX. The details of the support mechanism 18 will be described later.

The exhaust system 20 is configured to decompress the space in the processing container 12. In an exemplary embodiment, the exhaust system 20 includes an automatic pressure controller 20a, a turbo molecular pump 20b, and a dry pump 20c. The turbo molecular pump 20b is provided downstream of the automatic pressure controller 20a. The dry pump 20c is directly connected to the space inside the processing container 12 via a valve 20d. Further, the dry pump 20c is provided downstream of the turbo molecular pump 20b via a valve 20e.

The exhaust system including the automatic pressure controller 20a and the turbo molecular pump 20b is attached to the bottom portion of the processing container 12. Further, the exhaust system including the automatic pressure controller 20a and the turbo molecular pump 20b is provided directly under the support mechanism 18. Therefore, in the plasma processing apparatus 10, it is possible to form a uniform exhaust flow from the periphery of the support mechanism 18 to the exhaust system 20. As a result, efficient exhaust may be achieved. In addition, it is possible to uniformly diffuse the plasma generated in the processing container 12.

In an exemplary embodiment, a rectifying member 26 may be provided in the processing container 12. The rectifying member 26 has a substantially tubular shape closed at the lower end. The rectifying member 26 extends along the inner wall surface of the processing container 12 to surround the support mechanism 18 from the lateral side and the lower side. In an example, the rectifying member 26 has an upper portion 26a and a lower portion 26b. The upper portion 26a has a cylindrical shape with a constant width and extends along the inner wall surface of the intermediate portion 12a of the processing container 12. In addition, the lower portion 26b is continuous with the upper portion 26a below the upper portion 26a. The lower portion 26b has a tapered shape the width of which gradually narrows along the inner wall surface of the processing container 12, and has a flat plate shape at the lower end thereof. The lower portion 26b has a plurality of openings (through-holes) formed therein. According to the rectifying member 26, a pressure difference may be formed between the inside of the rectifying member 26, that is, the space where the wafer W is accommodated and the outside of the rectifying member 26, that is, the space on the exhaust side. Thus, it is possible to adjust the retention time of the gas in the space where the wafer W is accommodated. In addition, uniform exhaust may be implemented.

Figure 3:
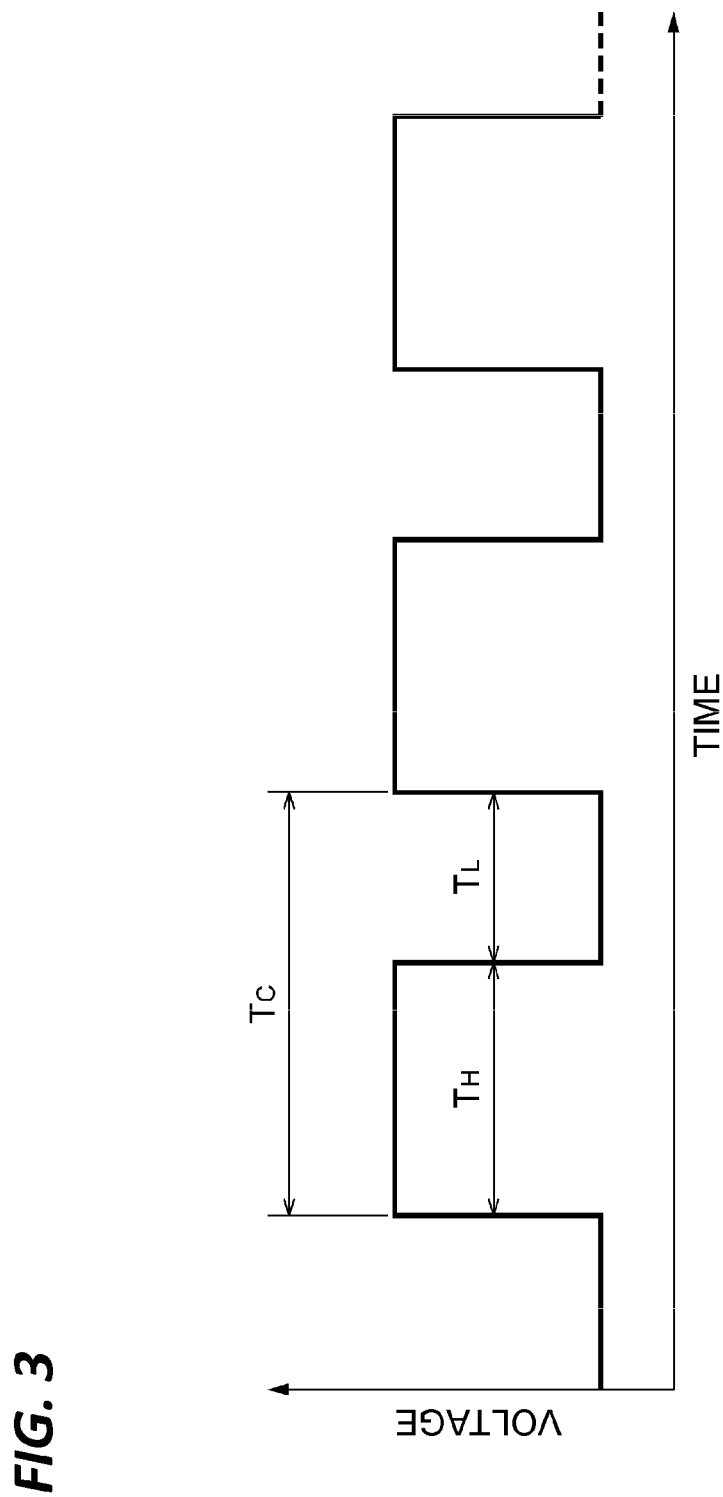
FIG. 3 is a diagram illustrating a pulse-modulated DC voltage.

The bias power supply unit 22 is provided outside the processing container 12 and configured to apply a bias for drawing ions into the wafer W to the support mechanism 18. In an exemplary embodiment, the bias power supply unit 22 includes a first power source 22a and a second power source 22b. The first power source 22a generates a pulse-modulated DC voltage (hereinafter referred to as a "modulated DC voltage") as a bias applied to the support mechanism 18. FIG. 3 is a diagram illustrating a pulse-modulated DC voltage. As illustrated in FIG. 3, the modulated DC voltage is a voltage alternately repeating a period $T_H$ for which the voltage value takes a high level and a period $T_L$ for which the voltage value takes a low level. The modulated DC voltage may be set to a voltage value in a range of, for example, 0 V to 1,200 V. The high-level voltage value of the modulated DC voltage is a voltage value set within the above-mentioned range of the voltage value, and the low-level voltage value of the modulated DC voltage is a voltage value lower than the high-level voltage value. As illustrated in FIG. 3, the sum of the period $T_H$ and the period $T_L$ continuous with the period $T_H$ constitutes one cycle $T_C$. Further, the frequency of the pulse modulation of the modulated DC voltage is $1/T_C$. The frequency of the pulse modulation may be arbitrarily set, but a frequency at which a sheath capable of accelerating ions may be formed, and is, for example, 400 kHz. In addition, the on-duty ratio, that is, the ratio occupied by the period $T_H$ in one cycle TC is a ratio in a range of 10% to 90%.

The second power source 22b is configured to supply a high frequency bias for drawing ions into the wafer W to the support mechanism 18. The frequency of the high frequency bias is an arbitrary frequency suitable for drawing ions into the wafer W, and is, for example, 400 kHz. The plasma processing apparatus 10 may selectively supply the modulated DC voltage from the first power source 22a and the high frequency bias from the second power source 22b to the support mechanism 18. When a modulated DC voltage is applied to the support mechanism 18, ions having a relatively low energy and a narrow energy band are drawn into the wafer W. Meanwhile, when a high frequency bias is applied to the support mechanism 18, ions having a relatively high energy and a relatively wide energy band are drawn into the wafer W. Therefore, according to the plasma processing apparatus 10, it is possible to perform etching depending on the film type by selectively supplying a modulated DC voltage from the first power source 22a and a high frequency bias from the second power source 22b to the support mechanism 18. For example, when etching a specific substance in a wafer, a modulated DC voltage may be supplied to the support mechanism 18, and when etching a film, the etching rate of which is to be prioritized, a high frequency bias may be supplied to the support mechanism 18. The selective supply of such modulated direct current voltage and high frequency bias may be controlled by the controller Cnt.

The controller Cnt is, for example, a computer including a processor, a storage unit, an input device, and a display device. The controller Cnt operates in accordance with a program based on the input recipe and transmits a control signal. Each part of the plasma processing apparatus 10 is controlled by a control signal from the controller Cnt.

Hereinafter, the gas supply system 14, the plasma source 16, and the support mechanism 18 will be described in detail.

[Gas Supply System]

As described above, the gas supply system 14 includes a first gas supply unit 14a and a second gas supply unit 14b. The first gas supply unit 14a supplies a first processing gas into the processing container 12 through one or more gas ejection holes 14e. The second gas supply unit 14b supplies a second processing gas into the processing container 12 through one or more gas ejection holes 14f. The gas ejection holes 14e are provided at a position closer to the plasma source 16 than the gas ejection holes 14f. Therefore, the first processing gas is supplied to a position closer to the plasma source 16 than the second processing gas. In FIGS. 1 and 2, the number of gas ejection holes 14e and gas ejection holes 14f is "1," respectively, but a plurality of gas ejection holes 14e and a plurality of gas ejection holes 14f may be provided. The plurality of gas ejection holes 14e may be evenly arranged in the circumferential direction with respect to the axis PX. In addition, the plurality of gas ejection holes 14e may be evenly arranged in the circumferential direction with respect to the axis PX.

In an exemplary embodiment, a partition plate called an ion trap may be provided between a region where the gas is ejected by the gas ejection hole 14e and a region where the gas is ejected by the gas ejection hole 14f. Thus, it becomes possible to adjust the number of ions flowing from the plasma of the first processing gas to the wafer W.

The first gas supply 14a may include one or more gas sources, one or more flow rate controllers, and one or more valves. Therefore, the flow rate of the first processing gas from one or more gas sources of the first gas supply unit 14a is adjustable. Further, the second gas supply 14b may include one or more gas sources, one or more flow rate controllers, and one or more valves. Therefore, the flow rate of the second processing gas from one or more gas sources of the second gas supply unit 14a is adjustable. The flow rate of the first processing gas from the first gas supply unit 14a and the supply timing of the first processing gas, and the flow rate of the second processing gas from the second gas supply unit 14b and the supply timing of the second processing gas are individually adjusted by the controller Cnt.

Hereinafter, two examples of the first processing gas and the second processing gas will be described.

In a first example, the first processing gas may be a noble gas. The noble gas is He gas, Ne gas, Ar gas, Kr gas, or Xe gas. Further, the first processing gas may be a gas selected from He gas, Ne gas, Ar gas, Kr gas, and Xe gas. Further, in the first example, the second processing gas may be a hydrogen-containing gas. Examples of the hydrogen-containing gas include $CH_4$ gas and $NH_3$ gas. In the first example, the first processing gas and the second processing gas may be excited by the plasma source 16. In the first example, the supply amounts of the first processing gas and the second processing gas at the time of plasma generation are individually controlled by the control by the controller Cnt.

In a second example, the first processing gas may be a decomposable gas that is dissociated by the plasma generated by the plasma source 16 to generate radicals. The radicals derived from the first processing gas may be radicals that cause a reduction reaction, an oxidation reaction, a chlorination reaction, or a fluorination reaction. The first processing gas may be a gas containing a hydrogen element, an oxygen element, a chlorine element, or a fluorine element. Specifically, the first processing gas may be, for example, Ar, $N_2$, $O_2$, $H_2$, He, $BCl_3$, $Cl_2$, $CF_4$, $NF_3$, $CH_4$, or $SF_6$. Examples of the first processing gas that generates radicals of the reduction reaction include $H_2$. Examples of the first processing gas that generates radicals of the oxidation reaction include $O_2$. Examples of the first processing gas that generates radicals of the chlorination reaction include $BCl_3$ and $Cl_2$. Examples of the first processing gas that generates radicals of the fluorination reaction include $CF_4$, $NF_3$, and $SF_6$.

Further, in the second example, the second processing gas may be a gas that reacts with an etching target substance without being exposed to plasma. The second process gas may include, for example, a gas whose reaction with an etching target substance depends on the temperature of the support mechanism 18. Specific examples of the second processing gas include HF, $Cl_2$, HCl, $H_2O$, $PF_3$, $F_2$, $ClF_3$, $COF_2$, cyclopentadiene, and amidinato. In addition, the second processing gas may include an electron donating gas. The electron donating gas generally refers to a gas constituted with atoms having greatly different electronegativity or ionization potential or a gas containing atoms having a lone pair of electrons. The electron donating gas has a property of easily giving electrons to other compounds. For example, the electron donating gas has a property of binding with a metal compound as a ligand and evaporating. Examples of the electron donating gas include $SF_6$, $PH_3$, PF3, $PCl_3$, $PBr_3$, $PI_3$, $CF_4$, $AsH_3$, $SbH_3$, $SO_3$, $SO_2$, $H_2S$, $SeH_2$, $TeH_2$, $Cl_3F$, $H_2O$, and $H_2O_2$, or a gas containing a carbonyl group.

In the second example, the first processing gas and the second processing gas may be alternately supplied. When the first processing gas is supplied, plasma is generated by the plasma source 16, and when the second gas is supplied, generation of plasma by the plasma source 16 is stopped. The supply of the first processing gas and the second processing gas is controlled by the controller Cnt. That is, in the second example, the supply amount of the first processing gas and the supply amount of the second processing gas according to the plasma state at the time of plasma generation and at the time of plasma extinction may be implemented by the control of the first gas supply unit 14a and the second gas supply unit 14b by the controller Cnt.

[Plasma Source]

Figure 4:
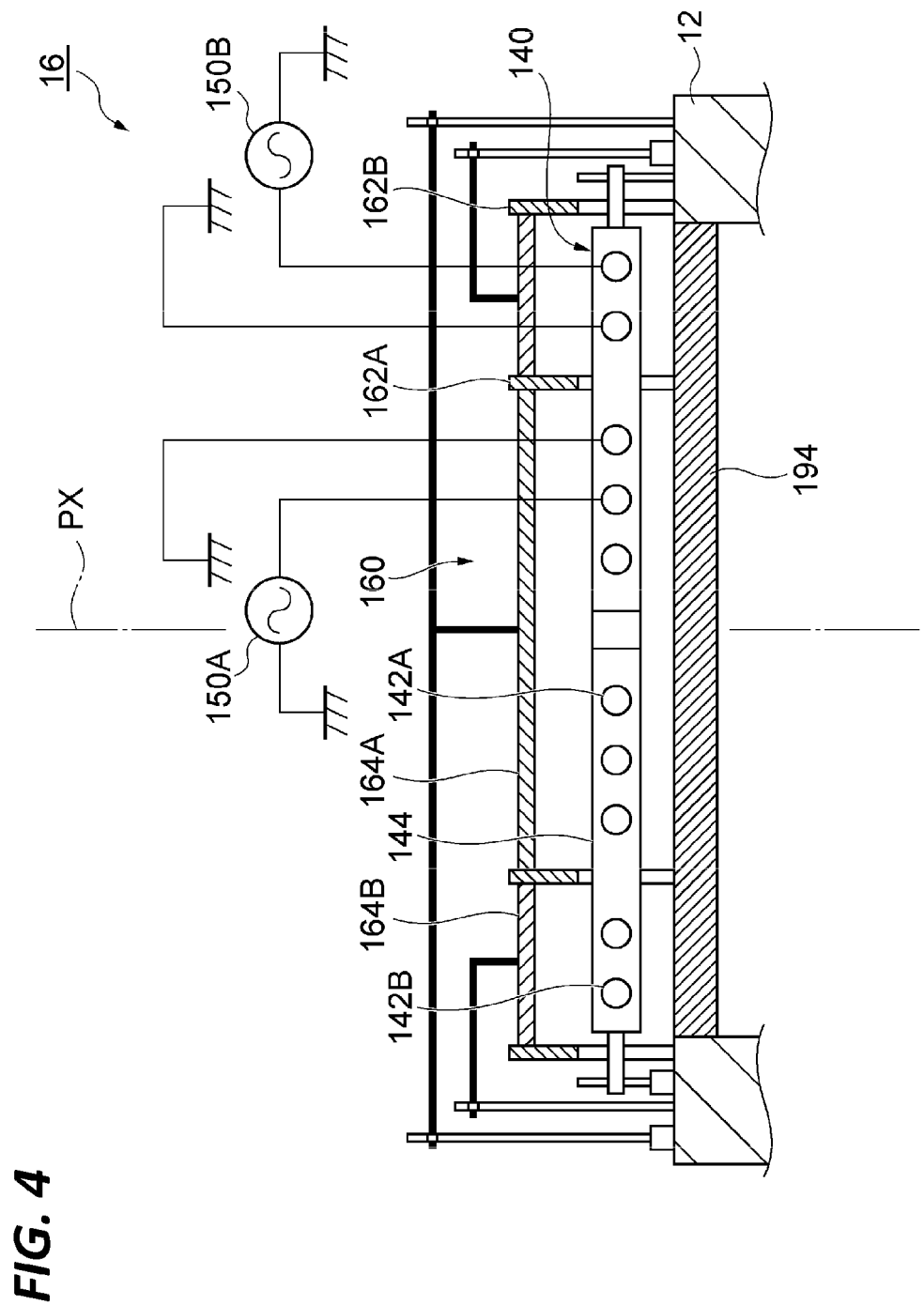
FIG. 4 is a view illustrating a plasma source of an exemplary embodiment.
Figure 5:
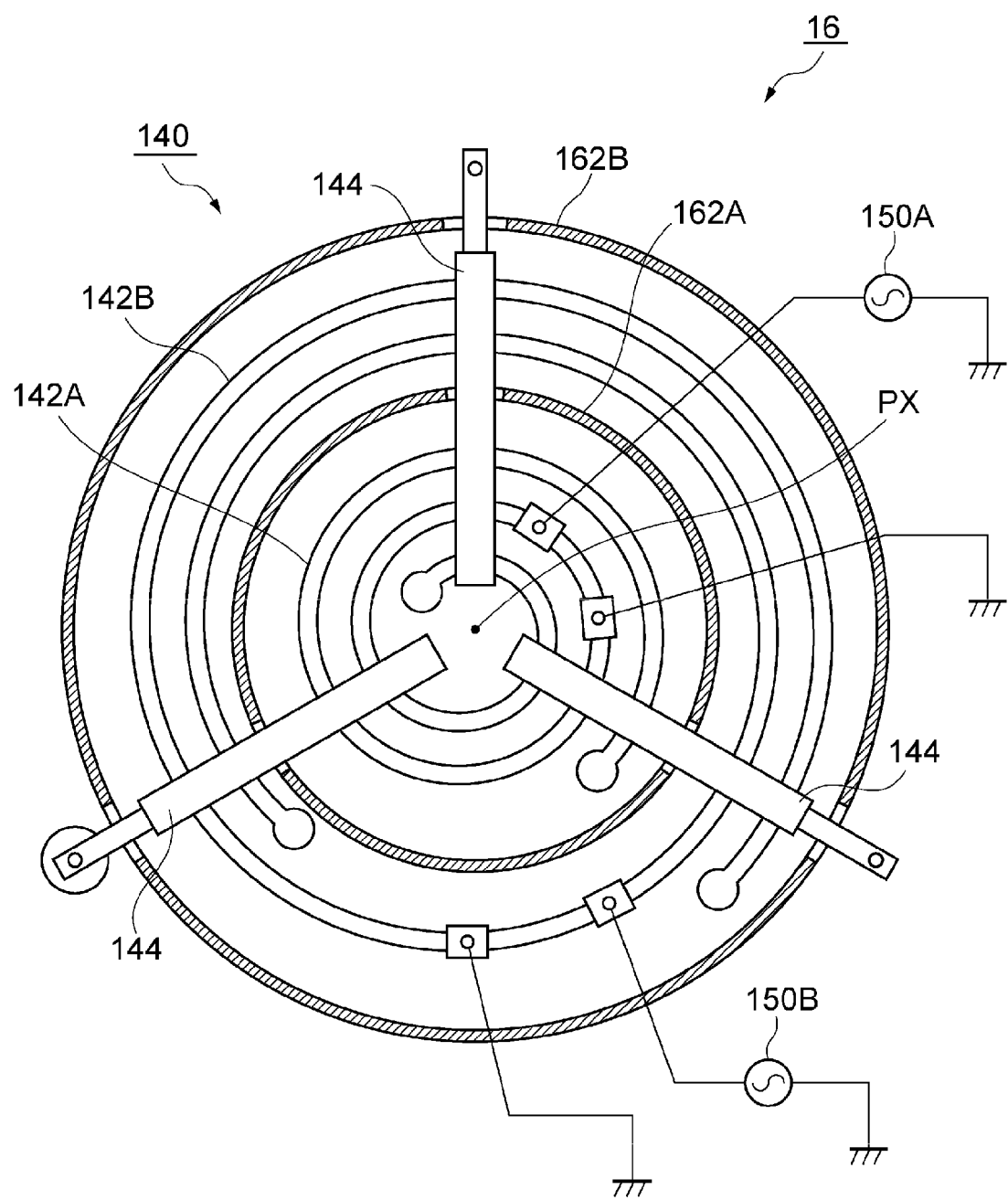
FIG. 5 is a view illustrating a plasma source of an exemplary embodiment.

FIG. 4 is a view illustrating a plasma source according to an exemplary embodiment as viewed from the Y direction in FIG. 1. Further, FIG. 5 is a view illustrating a plasma source according to an exemplary embodiment as viewed from the vertical direction. As illustrated in FIGS. 1 and 4, an opening is provided in the top portion of the processing container 12, and the opening is closed by a dielectric plate 194. The dielectric plate 194 is a plate-like body and is made of quartz glass or ceramic. The plasma source 16 is provided on the dielectric plate 194.

More specifically, as illustrated in FIGS. 4 and 5, the plasma source 16 has a high frequency antenna 140 and a shield member 160. The high frequency antenna 140 is covered with the shield member 160. In an exemplary embodiment, the high frequency antenna 140 includes an inner antenna element 142A and an outer antenna element 142B. The inner antenna element 142A is provided closer to the axis PX than the outer antenna element 142B. In other words, the outer antenna element 142B is provided outside the inner antenna element 142A so as to surround the inner antenna element 142A. Each of the inner antenna element 142A and the outer antenna element 142B is made of a conductor such as, for example, copper, aluminum, or stainless steel, and extends in a spiral shape around the axis PX.

The inner antenna element 142A and the outer antenna element 142B are held by a plurality of holders 144 and are integrated. The plurality of holders 144 are, for example, rod-like members and are arranged radially with respect to the axis PX.

The shield member 160 has an inner shield wall 162A and an outer shield wall 162B. The inner shield wall 162A has a tubular shape extending in the vertical direction and is provided between the inner antenna element 142A and the outer antenna element 142B. The inner shield wall 162A surrounds the inner antenna element 142A. Further, the outer shield wall 162B has a tubular shape extending in the vertical direction and is provided to surround the outer antenna element 142B.

An inner shield plate 164A is provided on the inner antenna element 142A. The inner shield plate 164A has a disc shape and is provided to close the opening of the inner shield wall 162A. Further, an outer shield plate 164B is provided on the outer antenna element 142B. The outer shield plate 164B is an annular plate and is provided to close the opening between the inner shield wall 162A and the outer shield wall 162B.

The inner antenna element 142A and the outer antenna element 142B are connected to a high frequency power source 150A and a high frequency power source 150B, respectively. The high frequency power source 150A and the high frequency power source 150B are high frequency power sources for plasma generation. The high frequency power source 150A and the high frequency power source 150B supply high frequency power of the same frequency or different frequencies to the inner antenna element 142A and the outer antenna element 142B, respectively. For example, when a high frequency power of a predetermined frequency (e.g., 40 MHz) is supplied from the high frequency power source 150A to the inner antenna element 142A with a predetermined power, the processing gas introduced into the processing container 12 is excited by the induction magnetic field formed in the processing container 12, so that donut-shaped plasma is generated in the central portion of the wafer W. Further, when a high frequency power of a predetermined frequency (e.g., 60 MHz) is supplied from the high frequency power source 150B to the outer antenna element 142B with a predetermined power, the processing gas introduced into the processing container 12 is excited by the induction magnetic field formed in the processing container 12, so that another donut-shaped plasma is generated in the peripheral portion of the wafer W. These plasmas generate radicals from the processing gas.

The frequencies of the high frequency power output from the high frequency power source 150A and the high frequency power source 150B are not limited to the above-described frequencies. For example, the frequencies of the high frequency power output from the high frequency power source 150A and the high frequency power source 150B may be various frequencies such as 13.56 MHz, 27 MHz, 40 MHz, and 60 MHz. However, it is necessary to adjust the electrical lengths of the inner antenna element 142A and the outer antenna element 142B depending on the high frequencies output from the high frequency power source 150A and the high frequency power source 150B.

The plasma source 16 may ignite the plasma of the processing gas even under an environment of a pressure of 1 mTorr (0.1333 Pa). Under the low-pressure environment, the mean free path of the ions in the plasma becomes large. Therefore, etching may be performed by sputtering of ions of noble gas atoms. Further, under the low-pressure environment, it is possible to exhaust etched substances while suppressing reattachment of the substances to the wafer W.

[Support Mechanism]

Figure 6:
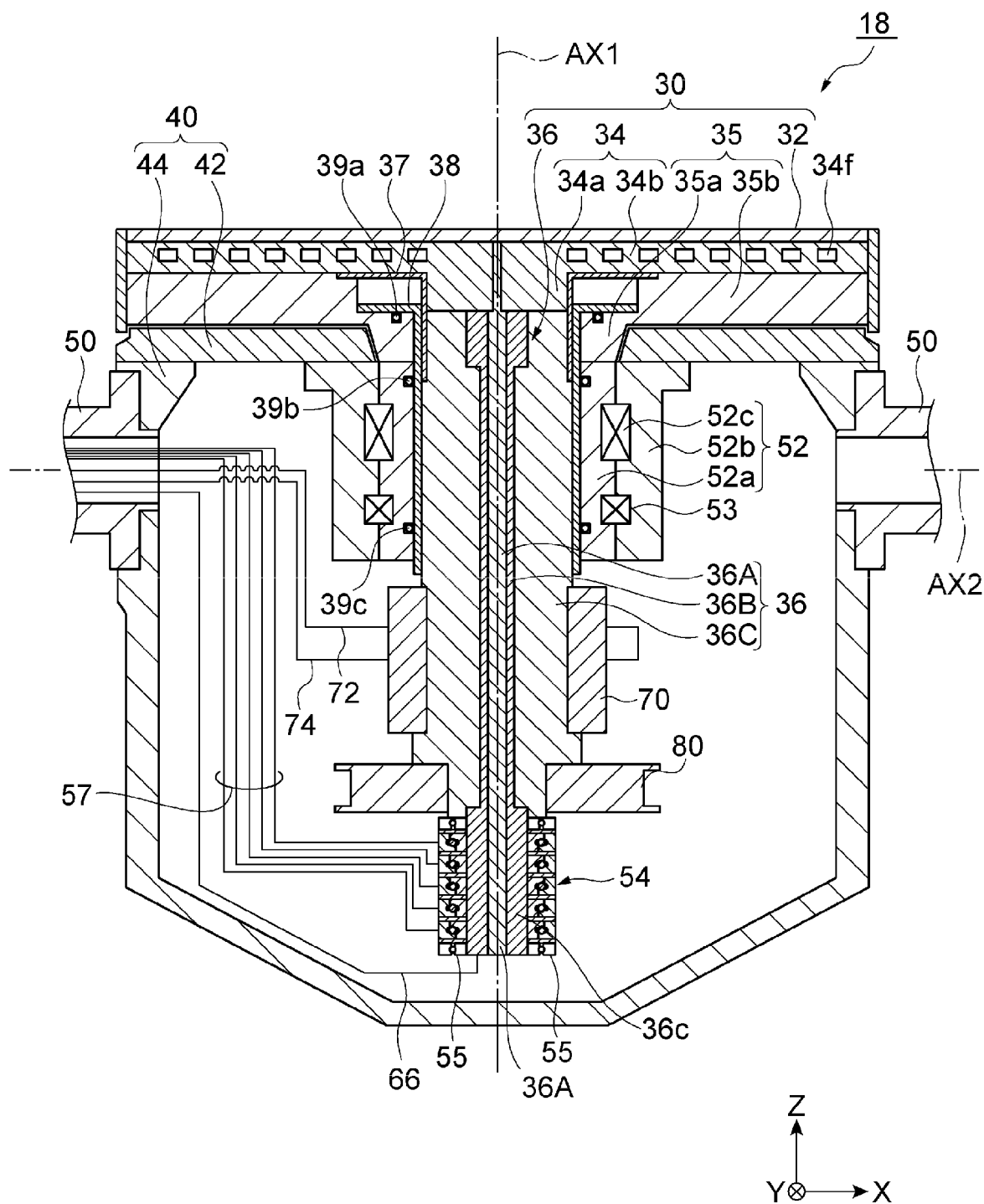
FIG. 6 is a cross-sectional view illustrating a support mechanism according to an exemplary embodiment.
Figure 7:
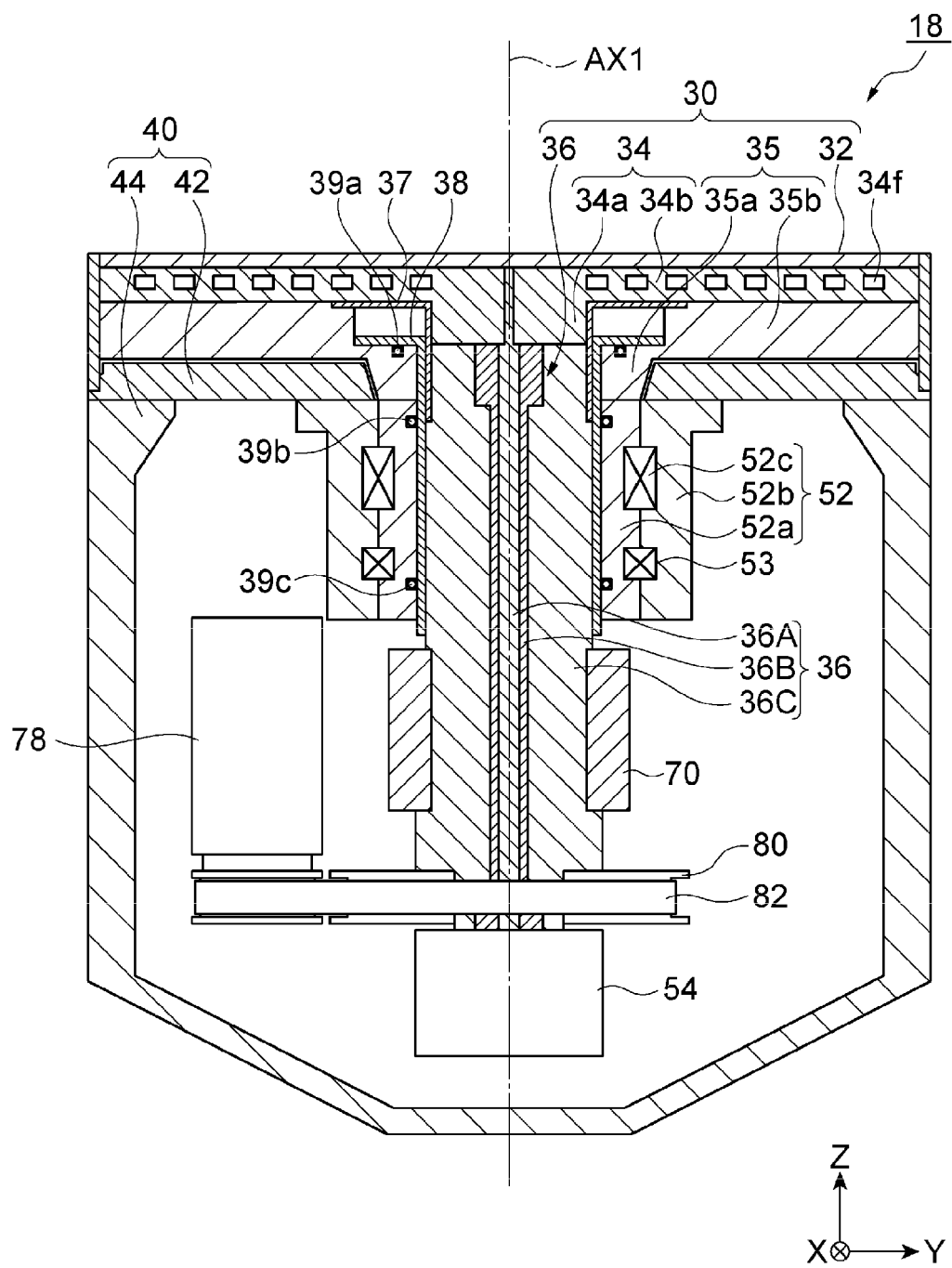
FIG. 7 is a cross-sectional view illustrating a support mechanism according to an exemplary embodiment.

FIGS. 6 and 7 are cross-sectional views illustrating a support mechanism according to an exemplary embodiment. FIG. 6 illustrates a cross-sectional view of the support mechanism as viewed from the Y direction (see FIG. 1), and FIG. 7 illustrates a cross-sectional view of the support mechanism as viewed from the X direction (see FIG. 1). As illustrated in FIGS. 6 and 7, the support mechanism 18 includes a driving device 24, a holding part 30, a container part 40, a tilting shaft part 50, a rotary connector 54, and a driving device 78.

The holding part 30 is a mechanism that holds the wafer W and rotates the wafer W by rotating around the first axis AX1. As described above, the first axis AX1 coincides with the axis PX when the support mechanism 18 is not tilted. The holding part 30 includes an electrostatic chuck 32, a lower electrode 34, an insulating member 35, and a rotary shaft part 36. The plurality of conductors are coaxially provided such that center axes thereof coincide with the first axis AX1.

The electrostatic chuck 32 is configured to hold the wafer W on the upper surface thereof and is provided on the lower electrode 34. The electrostatic chuck 32 has a substantially disk shape having the first axis AX1 as its central axis and includes an electrode film 32a provided as an inner layer of an insulating film as described later. The electrostatic chuck 32 generates an electrostatic force by applying a voltage from the DC power source 27 to the electrode film 32a. The DC power source 27 is provided outside the processing container 12. The electrostatic chuck 32 attracts the wafer W placed on its upper surface by electrostatic force.

The lower electrode 34 has a substantially disc shape having the first axis AX1 as its central axis. In an exemplary embodiment, the lower electrode 34 includes a first portion 34a and a second portion 34b. The first portion 34a is a portion on the center side of the lower electrode 34 extending along the first axis AX1, and the second portion 34b is a portion that is more distant from the first axis AX1 than the first portion 34a, that is, a portion that extends outward of the first portion 34a. The upper surface of the first portion 34a and the upper surface of the second portion 34b are continuous with each other, and the upper surface of the first portion 34a and the upper surface of the second portion 34b constitute a substantially flat upper surface of the lower electrode 34. The electrostatic chuck 32 is in contact with the upper surface of the lower electrode 34. In addition, the first portion 34a protrudes downward from the second portion 34b and has a columnar shape. That is, the lower surface of the first portion 34a extends below the lower surface of the second portion 34b. The lower electrode 34 is made of a conductor such as aluminum. The lower electrode 34 is electrically connected to the above-described bias power supply unit 22. That is, the lower electrode 34 may be selectively supplied with the modulated DC voltage from the first power source 22a and the high frequency bias from the second power source 22b. Further, the lower electrode 34 is provided with a coolant flow path 34f. The temperature of the wafer W is controlled by supplying a coolant to the coolant flow path 34f. The lower electrode 34 is provided on the insulating member 35.

The insulating member 35 is made of an insulator such as quartz or alumina, and has a substantially disc shape opened at the center. In an exemplary embodiment, the insulating member 35 includes a first portion 35a and a second portion 35b. The first portion 35a is a portion on the center side of the insulating member 35, and the second portion 35b is a portion that is more distant from the first axis AX1 than the first portion 35a, that is, a portion that extends outward of the first portion 35a. The upper surface of the first portion 35a extends below the upper surface of the second portion 35b. In addition, the lower surface of the first portion 35a also extends below the lower surface of the second portion 35b. The upper surface of the second portion 35b of the insulating member 35 is in contact with the lower surface of the second portion 34b of the lower electrode 34. Meanwhile, the upper surface of the first portion 35a of the insulating member 35 is separated from the lower surface of the lower electrode 34.

The rotary shaft part 36 extends under the lower electrode 34. The central axis of the rotary shaft part 36 coincides with the first axis AX1. A rotating force is applied to the rotary shaft part 36, so that the holding portion 30 is rotated.

The holding part 30 constituted by such various elements forms a space as the internal space of the support mechanism 18 together with the container part 40. The container part 40 includes an upper container part 42, and an outer container part 44. The upper container part 42 has a substantially disc shape. A through-hole through which the rotary shaft part 36 passes is formed at the center of the upper container part 42. The upper container part 42 is provided below the second portion 35b of the insulating member 35 so as to provide a slight gap with respect to the second portion 35b. Further, an upper end of the outer container part 44 is coupled to a lower peripheral edge of the upper container part 42. The outer container part 44 has a substantially cylindrical shape closed at the lower end.

A magnetic fluid seal part 52 is provided between the container part 40 and the rotary shaft part 36. The magnetic fluid seal part 52 has an inner ring portion 52a and an outer ring portion 52b. The inner ring portion 52a has a substantially cylindrical shape extending coaxially with the rotary shaft part 36 and is fixed to the rotary shaft part 36. The upper end portion of the inner ring portion 52a is coupled to the lower surface of the first portion 35a of the insulating member 35. The inner ring portion 52a is configured to rotate together with the rotary shaft part 36 around the first axis AX1. The outer ring portion 52b has a substantially cylindrical shape and is provided coaxially with the inner ring portion 52a on the outer side of the inner ring portion 52a. The upper end portion of the outer ring portion 52b is coupled to the lower surface of the central side portion of the upper container part 42. A magnetic fluid 52c is interposed between the inner ring portion 52a and the outer ring portion 52b. Further, a bearing 53 is provided between the inner ring portion 52a and the outer ring portion 52b below the magnetic fluid 52c. This magnetic fluid seal part 52 provides a sealing structure that airtightly seals the internal space of the support mechanism 18. With the magnetic fluid seal part 52, the internal space of the support mechanism 18 is separated from the space S of the plasma processing apparatus 10. In the plasma processing apparatus 10, the internal space of the support mechanism 18 is maintained at the atmospheric pressure. The rotary shaft part 36, the rotary connector 54, and the driving device 78 are provided in the inner space of the support mechanism 18. The rotary shaft part 36, the rotary connector 54, and the driving device 78 are protected from the plasma generated in the space S.

In an exemplary embodiment, a first member 37 and a second member 38 are provided between the magnetic fluid seal part 52 and the rotary shaft part 36. The first member 37 has a substantially cylindrical shape extending along a part of the outer peripheral surface of the rotary shaft part 36, that is, an outer peripheral surface of an upper portion of a tubular portion 36C (to be described later) and the outer peripheral surface of the first portion 34a of the lower electrode 34. Further, the upper end of the first member 37 has an annular plate shape extending along the lower surface of the second portion 34b of the lower electrode 34. The first member 37 is in contact with the outer peripheral surface of the upper portion of the tubular portion 36C, and the outer peripheral surface of the first portion 34a and the lower surface of the second portion 34b of the lower electrode 34.

The second member 38 has a substantially cylindrical shape extending along the outer peripheral surface of the rotary shaft part 36, that is, an outer peripheral surface of a sixth tubular portion 36g and the outer peripheral surface of the first portion 37. The upper end of the second member 38 has an annular plate shape extending along the upper surface of the first portion 35a of the insulating member 35. The second member 38 is in contact with the outer peripheral surface of the sixth tubular portion 36g, the outer peripheral surface of the first member 37, the upper surface of the first portion 35a of the insulating member 35, and the inner peripheral surface of the inner ring portion 52a of the magnetic fluid seal part 52. A sealing member 39a (e.g., an O-ring) is interposed between the second member 38 and the upper surface of the first portion 35a of the insulating member 35. Further, sealing members 39b and 39c (e.g., O-rings) are interposed between the second member 38 and the inner peripheral surface of the magnetic fluid seal part 52. With such a structure, the space between the rotary shaft part 36 and the inner ring portion 52a of the magnetic fluid seal part 52 is sealed. As a result, even though there is a gap between the rotary shaft part 36 and the magnetic fluid seal part 52, the internal space of the support mechanism 18 is separated from the space S of the plasma processing apparatus 10.

The outer container part 44 has an opening formed therein along the second axis AX2. An inner end portion of the tilting shaft part 50 is fitted into the opening formed in the outer container part 44. The tilting shaft part 50 has a substantially cylindrical shape, and the central axis thereof coincides with the second axis AX2. The tilting shaft part 50 extends to the outside of the processing container 12 as illustrated in FIG. 1. The above-described driving device 24 is coupled to one outer end portion of the tilting shaft part 50. The driving device 24 pivotally supports one outer end portion of the tilting shaft part 50. As the tilting shaft part 50 is rotated by the driving device 24, the support mechanism 18 is rotated around the second axis AX2, and as a result, the support mechanism 18 is tilted with respect to the axis PX. For example, the support mechanism 18 may be tilted such that the first axis AX1 forms an angle within a range of 0° to 60° with respect to the axis PX.

In an exemplary embodiment, the second axis AX2 includes the center position of the support mechanism 18 in the first axis AX1 direction. In this exemplary embodiment, the tilting shaft part 50 extends on the second axis AX2 passing through the center of the support mechanism 18. In this embodiment, when the support mechanism 18 is tilted, it is possible to increase the minimum distance among the shortest distance WU between the upper edge of the support mechanism 18 and the processing container 12 (or the rectifying member 26) (see FIG. 2) and the shortest distance WL between the lower edge of the support mechanism 18 and the processing container 12 (or the rectifying member 26) (see FIG. 2). That is, it is possible to maximize the minimum distance between the outer shell of the support mechanism 18 and the processing container 12 (or the rectifying member 26). Therefore, it is possible to reduce the horizontal width of the processing container 12.

In another exemplary embodiment, the second axis AX2 includes a position between the center of the support mechanism 18 in the first axis AX1 direction and the upper surface of the holding part 30. That is, in this exemplary embodiment, the tilting shaft part 50 extends at a position deviated toward the holding part 30 side from the center of the support mechanism 18. According to this exemplary embodiment, when the support mechanism 18 is tilted, a difference in distance from the plasma source 16 to each position of the wafer W may be reduced. Therefore, the in-plane uniformity of etching is further improved. The support mechanism 18 may be tilted at an angle of 60 degrees or less.

In yet another exemplary embodiment, the second axis AX2 includes a center of gravity of the support mechanism 18. In this exemplary embodiment, the tilting shaft part 50 extends on the second axis AX2 including the center of gravity. According to this exemplary embodiment, the torque required for the driving device 24 is reduced, and the control of the driving device 24 is facilitated.

Referring back to FIGS. 6 and 7, wires for various electrical systems, pipes for a heat transfer gas, and pipes for a refrigerant are passed through the inner hole of the tilting shaft part 50. These wires and pipes are connected to the rotary shaft part 36.

The rotary shaft part 36 has a conductor portion 36A including a plurality of conductors. The plurality of conductors of the conductor portion 36A are provided coaxially with the first axis AX1 as their center axis, as will be described in detail later. The plurality of conductors of the conductor portion 36A form an electrical path to a plurality of elements in the electrostatic chuck 32 and the lower electrode 34. The plurality of conductors of the conductor portion 36A are electrically connected to the plurality of slip rings of the rotary connector 54, respectively. Further, the rotary shaft part 36 includes a tubular portion 36B provided coaxially with the conductor portion 36A outside the conductor portion 36A, and a tubular portion 36C provided coaxially with the tubular portion 36B outside the tubular portion 36B.

A gas line for supplying a heat transfer gas is formed in the tubular portion 36B. This gas line is connected to a pipe 66 via a rotary joint such as a swivel joint. The pipe 66 extends from the inner space of the support mechanism 18 to the outside of the processing container 12 through the inner hole of the tilting shaft part 50. The pipe 66 is connected to a source 68 (see FIG. 1) of a heat transfer gas such as He gas outside the processing container 12. The heat transfer gas is supplied between the electrostatic chuck 32 and the wafer W.

The tubular portion 36C is provided coaxially with the tubular portion 36B outside the tubular portion 36B. The tubular portion 36C is formed with a coolant supply line for supplying a coolant to the coolant flow path 34f and a coolant recovery line for recovering the coolant supplied to the coolant flow path 34f. The coolant supply line is connected to a pipe 72 via a rotary joint 70 such as a swivel joint. Further, the coolant supply line is connected to a pipe 74 via the rotary joint 70. The pipe 72 and the pipe 74 extend from the inner space of the support mechanism 18 to the outside of the processing container 12 through the inner hole of the tilting shaft part 50. In addition, the pipe 72 and the pipe 74 are connected to a chiller unit 76 (see FIG. 1) outside the processing container 12.

In an exemplary embodiment, the rotary connector 54 is provided with a bearing 55. The bearing 55 supports the rotary shaft part 36 via the rotary connector 54. The above-described bearing 53 supports the upper portion of the rotary shaft part 36, whereas the bearing 55 supports the lower portion of the rotary shaft part 36. Since the rotary shaft part 36 is supported in both the upper side portion and the lower side portion by the two bearings 53 and 55 as described above, it is possible to stably rotate the rotary shaft part 36 around the first axis AX1.

As illustrated in FIG. 7, the driving device 78 (e.g., a rotary motor) is provided in the inner space of the support mechanism 18. The driving device 78 generates a driving force for rotating the rotating shaft portion 36. In an exemplary embodiment, the driving device 78 is provided on the lateral side of the rotary shaft part 36. The driving device 78 is connected to a pulley 80 attached to the rotary shaft part 36 via a conduction belt 82. Accordingly, the rotational driving force of the driving device 78 is transmitted to the rotary shaft part 36, and the holding part 30 is rotated around the first axis AX1. The rotation speed of the holding part 30 is, for example, within a range of 48 rpm or less. For example, the holding part 30 is rotated at a rotation speed of 20 rpm during the process. The wire for supplying a power to the driving device 78 is drawn to the outside of the processing container 12 through the inner hole of the tilting shaft part 50 and connected to a motor power source provided outside the processing container 12.

Thus, the support mechanism 18 may be provided with various mechanisms in the internal space that may be maintained at the atmospheric pressure. Further, the support mechanism 18 is configured such that wires or pipes for connecting the mechanism accommodated in the internal space thereof and a device such as a power source, a gas source, or a chiller unit provided outside the processing container 12 can be drawn to the outside of the processing container 12.

Figure 8:
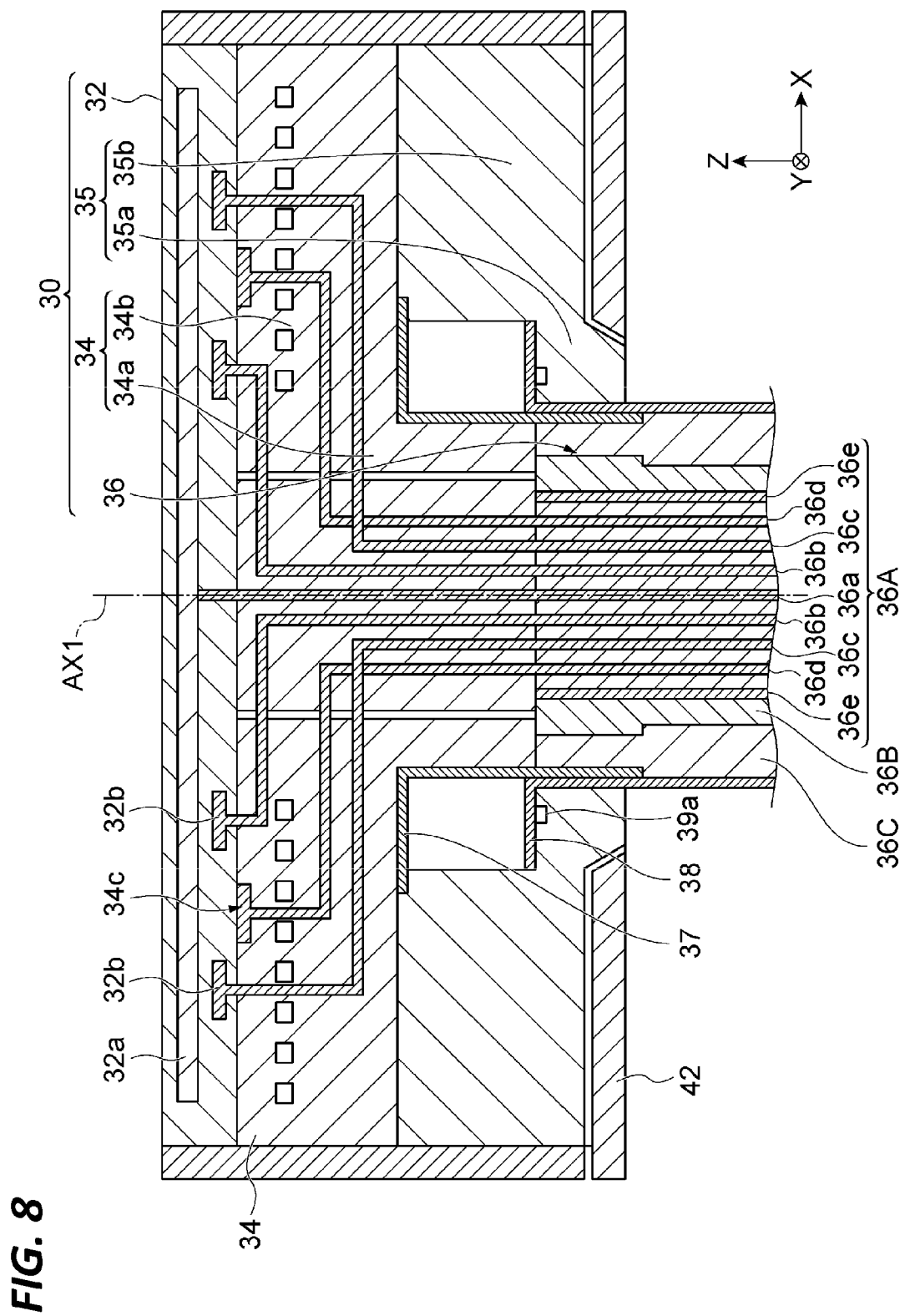
FIG. 8 is a cross-sectional view illustrating a holding part and an upper portion of a rotary shaft part according to an exemplary embodiment in an enlarged scale.

Hereinafter, details of the rotary shaft part 36 and the rotary connector 54 will be described. FIG. 8 is a cross-sectional view illustrating the upper portion of the holding part 30 and the rotary shaft part 36. FIG. 8 illustrates a cross-sectional view as seen from the Y direction in FIG. 6. As illustrated in FIG. 8, the electrostatic chuck 32 includes an electrode film 32a provided as an inner layer of an insulating film. In addition, the electrostatic chuck 32 incorporates a heater 32b for heating the wafer W. The heater 32b may be restrained to generate heat of, for example, 16 W. As described above, the electrostatic chuck 32 is provided on the lower electrode 34. A temperature sensor 34c is provided in the lower electrode 34 to detect the temperature of the wafer W.

In an exemplary embodiment, the conductor portion 36A of the rotary shaft part 36 includes a conductor 36a, a conductor 36b, a conductor 36c, a conductor 36d, and a conductor 36e as a plurality of conductors. These conductors are provided coaxially with respect to the first axis AX1. The conductor 36a has a columnar shape and is connected to the electrode film 32a of the electrostatic chuck 32. The conductor 36b and the conductor 36c have a cylindrical shape. The conductor 36b and the conductor 36c supply a current to the heater 32b and are connected to two terminals of the heater 32b, respectively. The conductor 36d has a cylindrical shape. The conductor 36d transmits a signal of the temperature sensor 34c and is connected to the temperature sensor 34c. Further, the conductor 36e has a cylindrical shape. The conductor 36e supplies a bias from the bias power supply unit 22 to the lower electrode 34 and is connected to the lower electrode 34.

Figure 9:
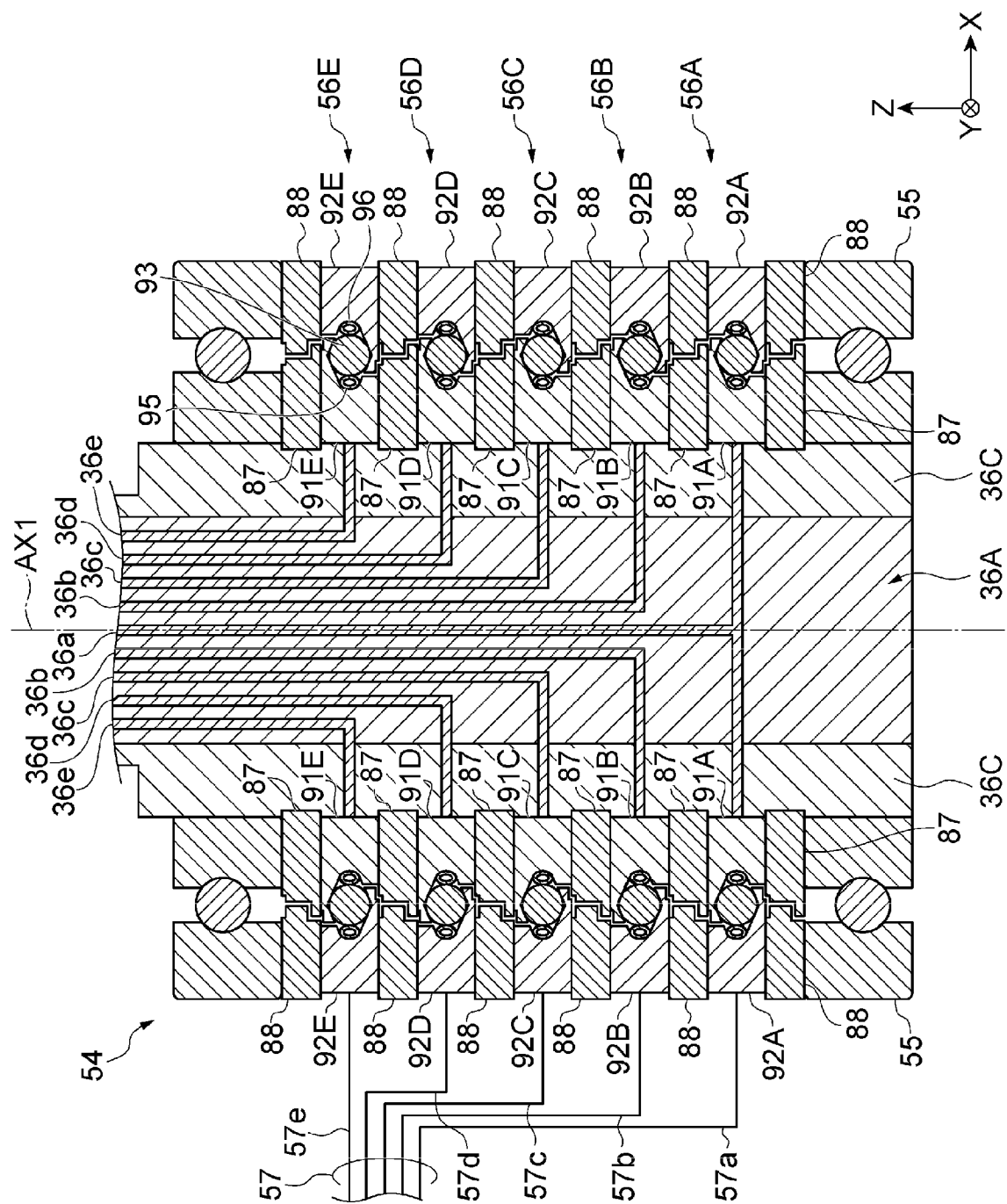
FIG. 9 is a cross-sectional view illustrating a lower portion of the rotary shaft part and rotary connector according to an exemplary embodiment.

FIG. 9 is a cross-sectional view illustrating the lower portion of the rotary shaft part 36 and the rotary connector 43 according to an exemplary embodiment. FIG. 9 illustrates a cross-sectional view as seen from the Y direction in FIG. 6. The plurality of conductors of the rotary shaft part 36 are connected to the plurality of slip rings of the rotary connector 54, respectively, on the lower end sides thereof. The plurality of slip rings of the rotary connector 54 are arranged such that their rotation axes coincide with the first axis AX1. In an exemplary embodiment, the rotary connector 54 has five slip rings stacked in the first axis AX1 direction, that is, a slip ring 56A, a slip ring 56B, a slip ring 56C, a slip ring 56D, and a slip ring 56E. As illustrated in FIG. 9, the conductor 36a is connected to a rotor 91A of the slip ring 56A, the conductor 36b is connected to a rotor 91B of the slip ring 56B, the conductor 36c is connected to a rotor 91C of the slip ring 56C, the conductor 36d is connected to a rotor 91D of the slip ring 56D, and the conductor 36 e is connected to a rotor 91E of the slip ring 56E. The conductor 36a extends in the Z direction, extends, for example, in a direction perpendicular to the Z direction at the lower end thereof, and is connected to the rotor 91A. Similarly, the conductor 36b, the conductor 36c, the conductor 36d, and the conductor 36e extend in the Z direction, and extend, for example, in the direction perpendicular to the Z direction at the lower ends thereof, and are connected to the rotor 91B, the rotor 91D, and the rotor 91E, respectively. In FIG. 9, the conductors 36a, 36b, 36c, 36d, and 36e are connected to the corresponding rotors 91A, 91B, 91C, 91D, and 91E at two points. However, each conductor may be connected to the corresponding rotor at one or more points.

A plurality of wires 57 are connected to stators of the slip rings 56A to 56E. Specifically, the plurality of wires 57 include a wire 57a, a wire 57b, a wire 57c, a wire 57d, and a wire 57e. The wire 57a is connected to a stator 92A of the slip ring 56A, the wire 57b is connected to a stator 92B of the slip ring 56B, the wire 57c is connected to a stator 92C of the slip ring 56C, the wire 57d is connected to a stator 92D of the slip ring 56D, and the wire 57e is connected to a stator 92E of the slip ring 56E. The plurality of wires 57 extend from the inner space of the support mechanism 18 to the outside of the processing container 12 through the inner hole of the tilting shaft part 50. The wire 57a is connected to the DC power source 27 outside the processing container 12. The wire 57a and the wire 57b are connected to the heater power source 28 outside the processing container 12. The wire 57d is connected to, for example, the controller Cnt outside the processing container 12. The wire 57e is connected to the bias power supply unit 22, that is, the first power source 22a and the second power source 22b outside the processing container 12. A matcher for impedance matching may be provided between the second power source 22b and the wire 57e.

As illustrated in FIG. 9, isolators 87 are provided on the lower surface of the rotor 91A of the slip ring 56A, between the rotor 91A of the slip ring 56A and the rotor 91B of the slip ring 56B, between the rotor 91B of the slip ring 56B and the rotor 91C of the slip ring 56C, between the rotor 91C of the slip ring 56C and the rotor 91D of the slip ring 56D, between the rotor 91D of the slip ring 56D and the rotor 91E of the slip ring 56E, and on the upper surface of the rotor 91E of the slip ring 56E. The isolator 87 is made of an insulator and has an annular shape extending in the circumferential direction with respect to a rotation axis RX1. The isolator 87 is made of, for example, polytetrafluoroethylene.

Further, isolators 88 are provided on the lower surface of the stator 92A of the slip ring 56A, between the stator 92A of the slip ring 56A and the stator 92B of the slip ring 56B, between the stator 92B of the slip ring 56B and the stator 91C of the slip ring 56C, between the stator 91C of the slip ring 56C and the stator 91D of the slip ring 56D, between the stator 91D of the slip ring 56D and the stator 91E of the slip ring 56E, and on the upper surface of the stator 91E of the slip ring 56E. The isolator 88 is made of an insulator and has an annular shape extending in the circumferential direction with respect to the rotation axis RX1. The isolator 88 is made of, for example, polytetrafluoroethylene.

Figure 10A:
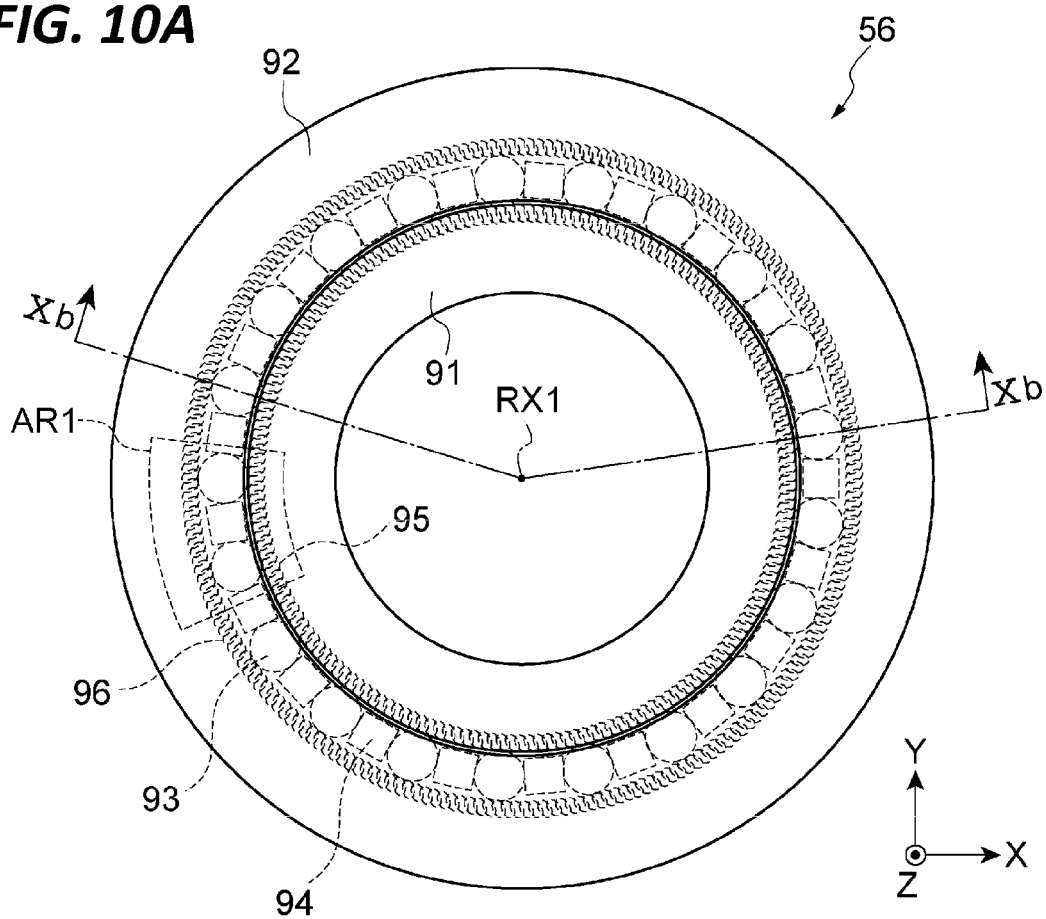
FIGS. 10A and 10B are views schematically illustrating a slip ring according to an exemplary embodiment.
Figure 10B:
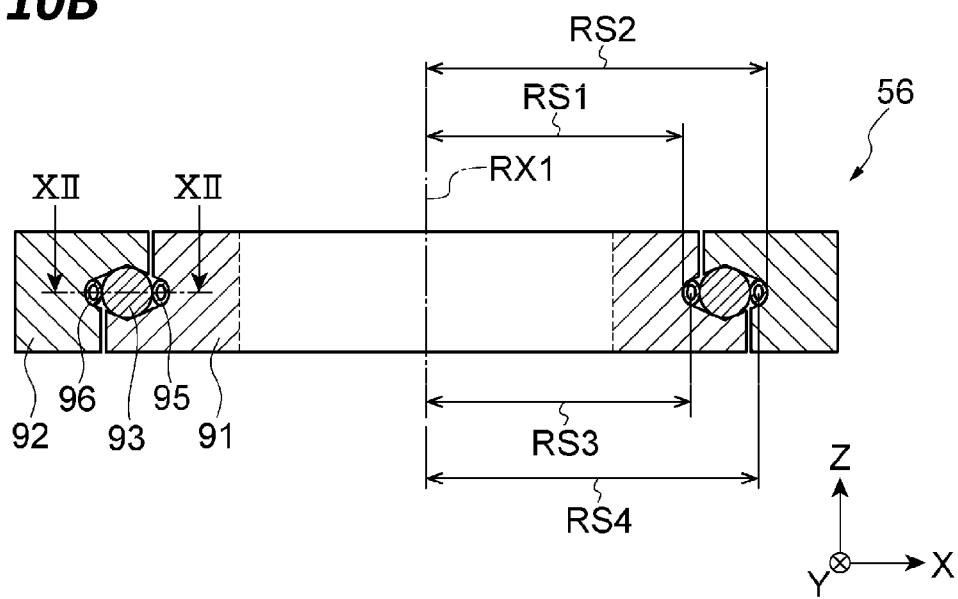
Figure 11A:
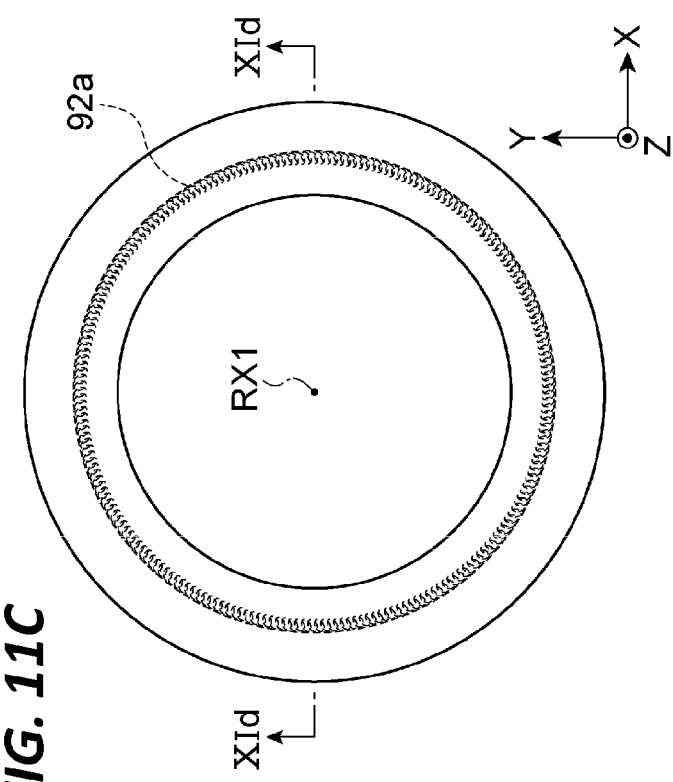
FIGS. 11A to 11D are views schematically illustrating respective parts of a slip ring according to an exemplary embodiment.
Figure 11B:
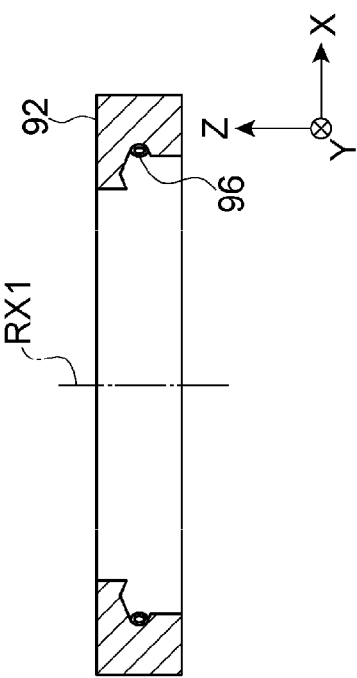
Figure 11C:
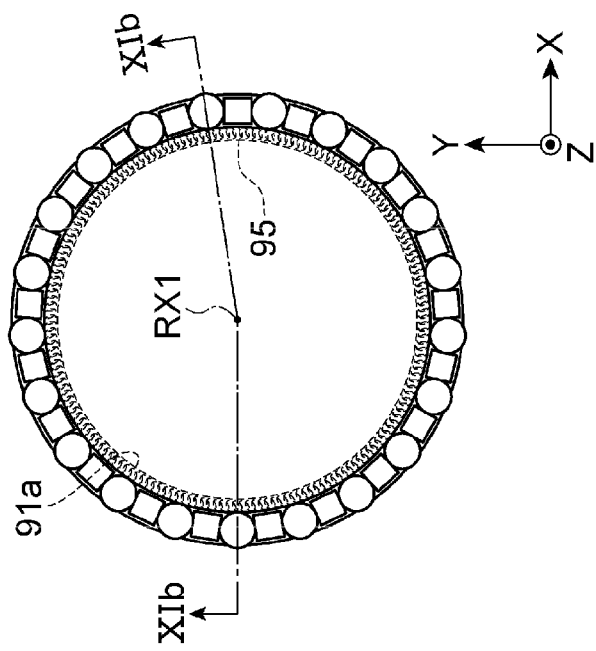
Figure 11D:
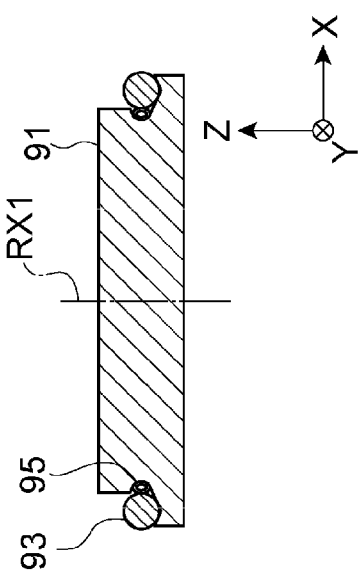

Hereinafter, a plurality of slip rings of the rotary connector 54 will be described with reference to FIGS. 10A and 10B, and 11A to 11D. FIGS. 10A and 10B are views schematically illustrating a slip ring according to an exemplary embodiment. FIG. 10A is a plan view of the slip ring as viewed in the rotation axis direction, and FIG. 10B is a cross-sectional view taken along line Xb-Xb illustrated in FIG. 10A. Further, FIGS. 11A to 11D are views schematically illustrating respective parts of the slip ring according to an exemplary embodiment. FIG. 11A is a plan view of the rotor of the slip ring as viewed in the rotation axis direction, and FIG. 11B is a cross-sectional view taken along line XIb-XIb illustrated in FIG. 11A. FIG. 11C is a plan view of the stator of the slip ring as viewed in the rotation axis direction, and FIG. 11D is a cross-sectional view taken along line XId-XId illustrated in FIG. 11C. The above-described slip rings 56A, 56B, 56C, 56D, and 56E have the same structure as that of the slip ring 56 illustrated in FIGS. 10A and 10B, and 11A to 11D. Hereinafter, the structure of the slip ring 56 will be described.

As illustrated in FIGS. 10A and 10B, and 11A to 11D, the slip ring 56 has a rotor 91 and a stator 92. In addition, the slip ring 56 further includes a plurality of spheres 93, a plurality of retainers 94, a coil spring 95, and a coil spring 96.

The rotor 91 is a substantially annular member extending in the circumferential direction at the center of the rotation axis RX1. The rotor 91 is rotatable around the rotation axis RX1. The stator 92 is a substantially annular member extending in the circumferential direction at the center of the rotation axis RX1. The stator 92 is provided coaxially with the rotor 91 outside the rotor 91 with respect to the rotation axis RX1. Both the rotor 91 and the stator 92 are made of a conductive material. The rotor 91 and the stator 92 provide therebetween a space extending in the circumferential direction with respect to the rotation axis RX1.

A plurality of spheres 93 and a plurality of retainers 94 are accommodated in the space provided by the rotor 91 and the stator 92. Specifically, in the space, the plurality of spheres 93 and the plurality of retainers 94 are alternately arranged along the circumferential direction. The plurality of spheres 93 are conductive and form an electrical path between the rotor 91 and the stator 92. For example, the plurality of spheres 93 may come in point contact with both the rotor 91 and the stator 92. The plurality of retainers 94 prevent contact between the plurality of spheres 93. In an exemplary embodiment, each of the plurality of retainers 94 is made of an insulating material. For example, each of the plurality of retainers 94 is made of polytetrafluoroethylene. In the case where these retainers 94 are made of polytetrafluoroethylene, abrasion of the spheres 93 due to contact friction between the spheres 93 and the retainers is reduced by the effect of surface lubrication.

As illustrated in FIGS. 11A to 11D, the rotor 91 provides a groove 91a. The groove 91a extends in the circumferential direction with respect to the rotation axis RX1 and is continuous with the space in which the plurality of spheres 93 and the plurality of retainers 94 are accommodated. The coil spring 95 is accommodated in the groove 91a. The coil spring 95 extends in the circumferential direction with respect to the rotation axis RX1. The coil spring 95 is conductive, and is provided between the plurality of spheres 93 and the rotor 91 to be in contact with the plurality of spheres 93 and the rotor 91. As illustrated in FIG. 10B, a portion closest to the rotation axis RX1 in the plane of the rotor 91 defining the groove 91a has a radius RS1 with respect to the rotation axis RX1. Further, the radius of the circular center line of the coil spring 95 is RS3, and the radius RS3 is larger than the radius RS1.

As illustrated in FIGS. 11A to 11D, the stator 92 provides a groove 92a. The groove 92a extends in the circumferential direction with respect to the rotation axis RX1 and is continuous with the space in which the plurality of spheres 93 and the plurality of retainers 94 are accommodated. The coil spring 96 is accommodated in the groove 92a. The coil spring 96 extends in the circumferential direction with respect to the rotation axis RX1. The coil spring 96 is conductive, and is provided between the plurality of spheres 93 and the stator 92 to be in contact with the plurality of spheres 93 and the stator 92. As illustrated in FIG. 10B, a portion closest to the rotation axis RX1 in the plane of the stator 92 defining the groove 92a has a radius RS2 with respect to the rotation axis RX1. Further, the radius of the circular center line of the coil spring 96 is RS4, and the radius RS4 is larger than the radius RS3 and smaller than the radius RS2.

In the slip ring 56 of the exemplary embodiment illustrated in FIGS. 10A and 10B, and 11A to 11D, the coil spring 96 extends in the circumferential direction at a position further away from the rotation axis RX1 than the coil spring 95. That is, the coil spring 95 and the coil spring 96 are arranged in the radial direction with respect to the rotation axis RX1. Hereinafter, the arrangement of the coil spring 95 and the coil spring 96 in the radial direction with respect to the rotation axis RX1 is referred to as a radial arrangement.

In a state where the rotor 91 and the stator 92 are combined with each other, the coil spring 95 is compressed and deformed between the plurality of spheres 93 and the rotor 91. Accordingly, the coil spring 95 is brought into contact with the plurality of spheres 93 and the rotor 91 at many points. In addition, in the state where the rotor 91 and the stator 92 are combined with each other, the coil spring 96 is compressed and deformed between the plurality of spheres 93 and the stator 92. Accordingly, the coil spring 96 is brought into contact with the plurality of spheres 93 and the stator 92 at many points.

In the slip ring 56, the electrical path between the rotor 91 and the stator 92 includes a path provided by point contact between the plurality of spheres 93 and the rotor 91 and a path provided by point contact between the plurality of spheres 93 and the stator 92, as well as a path provided by multiple point contact between the coil spring 95 and the plurality of spheres 93, a path provided by multiple point contact between the coil spring 95 and the rotor 91, a path provided by multiple point contact between the coil spring 96 and the plurality of spheres 93, and a path provided by multiple point contact of the coil spring 96 and the stator 92. Therefore, in the slip ring 56, the contact area is large and the contact resistance is reduced.

Figure 12:
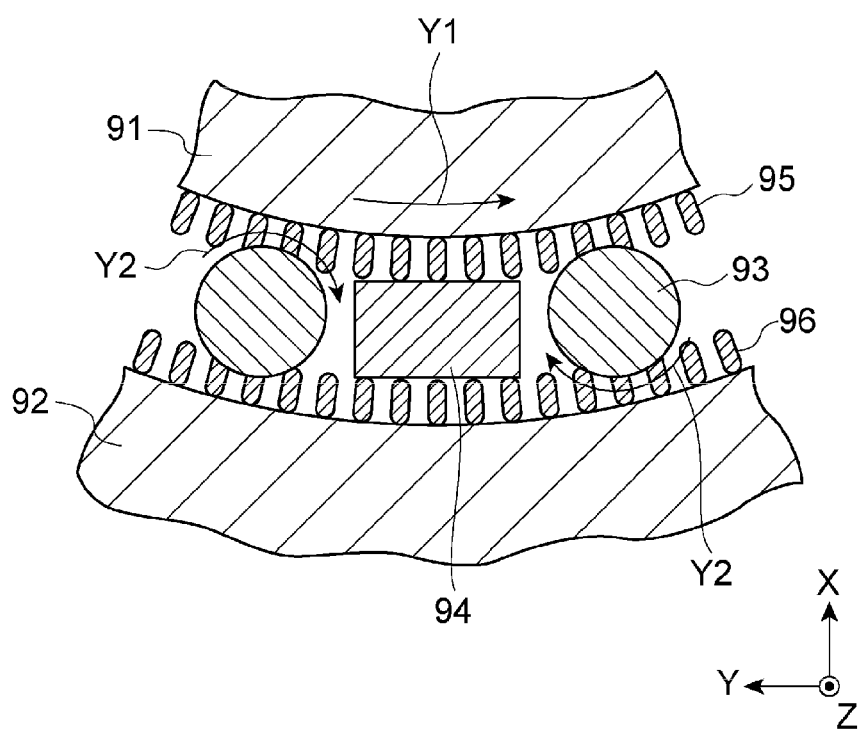
FIG. 12 is a schematic view illustrating a state of contact between a sphere and a coil spring.

Here, FIG. 12 will be referred to. FIG. 12 is a schematic view illustrating a state of contact between a sphere and a coil spring. FIG. 12 illustrates a cross-section taken along line XII-XII illustrated in FIG. 10B within a region AR1 illustrated in FIG. 10A. Further, in FIG. 12, the circumferential direction with respect to the rotation axis RX1 is illustrated as a Y1 direction. As illustrated in FIG. 12, for example, when the rotor 91 moves in the Y1 direction with respect to the stator 92, the plurality of spheres 93 rotate in a Y2 direction by spinning. As a result, rolling contact may occur between the coil spring 95 and the plurality of spheres 93, and between the coil spring 96 and the plurality of spheres 93. However, when the rotor 91 is rotated in a state where the pressures from the rotor 91 and the stator 92 to the plurality of spheres 93 are large, the frictional force between the coil springs and the spherical body 93 exceeds the spinning force of the plurality of spheres 93. Thus, the plurality of spheres 93 do not rotate but sliding friction occurs between the coil spring 95 and the plurality of spheres 93 and between the coil spring 96 and the plurality of spheres 93. In order to prevent such sliding friction, in an exemplary embodiment, the pressure from the rotor 91 and the stator 92 to the plurality of spheres 93 is adjusted such that the spinning force of the plurality of spheres 93 exceed the frictional force between the plurality of spheres 93 and the coil spring 95 and the frictional force between the plurality of spheres 93 and the coil spring 96. When the pressure is adjusted in this manner, a stable contact resistance between the plurality of spheres 93 and the coil spring 95 and a stable contact resistance between the plurality of spheres 93 and the coil spring 96 may be obtained. In addition, consumption of parts (e.g., the plurality of spheres 93, the coil spring 95, and the coil spring 96) due to friction is also reduced.

In an exemplary embodiment, an obliquely wound spring SCS illustrated in FIGS. 13A and 13B may be used for the coil spring 95 and the coil spring 96. FIG. 13A illustrates a plan view of an obliquely wound spring, and FIG. 13B illustrates a side view of the obliquely wound spring. The obliquely wound spring SCS illustrated in FIGS. 13A and 13B is wound around a circular center line CL. The wire rod of the obliquely wound spring SCS is wound around the center line CL while being tilted with respect to the tangential direction T1 of the center line CL over its entire length. The reaction force generated by the obliquely wound spring SCS against the plurality of spheres 93 is smaller than the reaction force generated by a general coil spring.

Figure 14A:
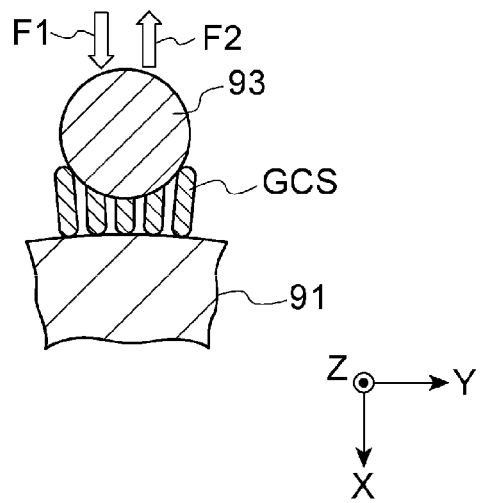
FIGS. 14A and 14B are cross-sectional views illustrating a relationship between the shape and the spring repulsion of the coil spring according to an exemplary embodiment.
Figure 14B:
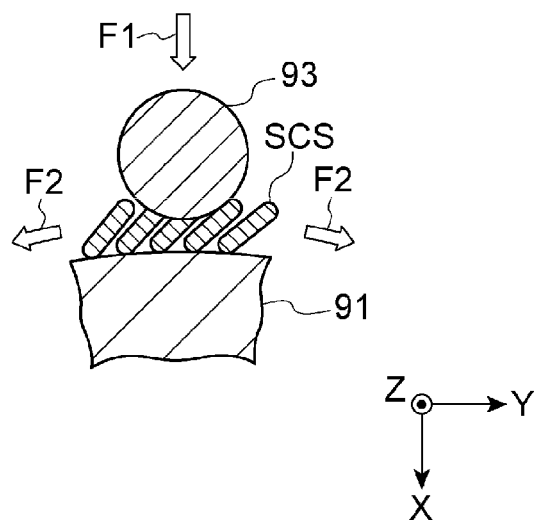

FIGS. 14A and 14B are cross-sectional views illustrating a relationship between the shape and the spring repulsion of the coil spring. FIG. 14A is a cross-sectional view of a general coil spring GCS in which the direction where the wire rod is wound is substantially orthogonal to the center line. In the cross-sectional view, a state where the sphere 93 is in contact with the coil spring GCS is illustrated. Further, FIG. 14B is a cross-sectional view of the obliquely wound spring SCS, in which the sphere 93 is in contact with the obliquely wound spring SCS.

As illustrated in FIG. 14A, when a load F1 illustrated in the figure is applied from a sphere 93 to the general coil spring GCS, a spring reaction force F2 is generated in a direction opposite to the direction of the load F1. Therefore, the contact pressure between the coil spring GCS and the sphere 93 increases. Further, the magnitude of the spring reaction force F2 depends on the pitch of the coil spring GCS and the diameter of the wire rod of the coil spring GCS. Meanwhile, as illustrated in FIG. 14B, when the illustrated load F1 is applied from the sphere 93 to the obliquely wound spring SCS, the spring reaction force F2 is generated in a direction orthogonal to the direction of the load F1, and the spring reaction force in the direction opposite to the direction of F1 is extremely small. Further, the obliquely wound spring SCS easily deforms in the direction of the load F1.

Therefore, when the obliquely wound spring SCS is used as the coil spring 95 and the coil spring 96, abrasion of parts (e.g., the coil spring 95, the coil spring 96, and the plurality of spheres 93) is suppressed. In addition, the contact area between the plurality of spheres 93 and the coil spring 95, the contact area between the plurality of spheres 93 and the coil spring 96 are increased, the contact resistance is further reduced, and the contact resistance is stabilized. Further, according to the obliquely wound spring SCS, the diameter of the wire rod may be increased, and the pitch of the wire rod in the obliquely wound spring SCS may be decreased without affecting the spring reaction force in the direction opposite to the direction of the load from the sphere 93.

Figure 15A:
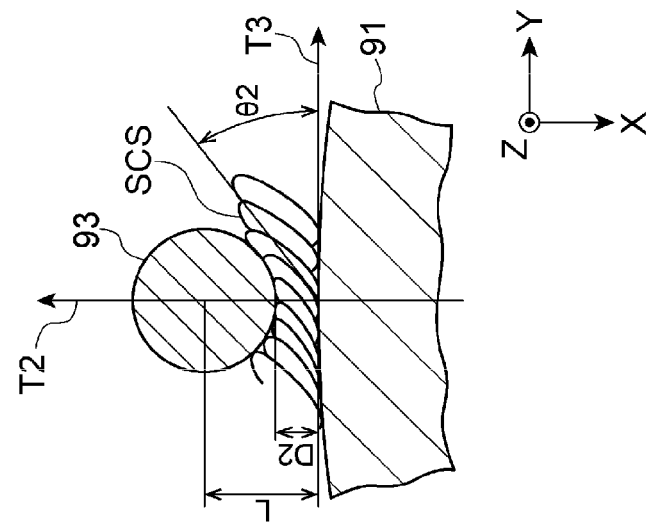
FIGS. 15A and 15B are views illustrating a relationship between a crush ratio and a contact resistance of an obliquely wound spring according to an exemplary embodiment.
Figure 15B:
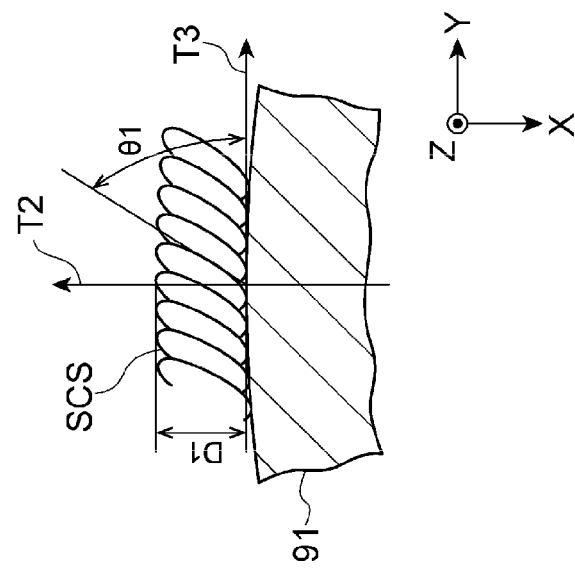

The magnitude of the spring reaction force of the obliquely wound spring SCS with respect to the load from the sphere 93 may be adjusted by the inclination angle of the wire rod of the obliquely winding spring SCS. Further, the contact resistance between the obliquely wound spring SCS and the sphere 93 may be adjusted by the crush ratio of the obliquely wound spring SCS. Hereinafter, descriptions will be made in detail with reference to FIGS. 15A and 15B. FIGS. 15A and 15B are views illustrating a relationship between a crush ratio and a contact resistance of the obliquely wound spring SCS. FIG. 15A illustrates the obliquely wound spring SCS in a state where the sphere 93 is not in contact (i.e., in a free state), and FIG. 15B illustrates the obliquely wound spring SCS in a state where the sphere 93 is in contact.

In the state illustrated in FIG. 15A, the wire rod of the obliquely wound spring SCS is tilted at an inclination angle θ1 with respect to a tangential direction T3 at the contact position of the wire rod. In this state, a width of the obliquely wound spring SCS in a direction T2 orthogonal to the tangential direction T3 is D1. In the state illustrated in FIG. 15B, the load from the sphere 93 is applied to the obliquely wound spring SCS. Thus, an inclination angle θ2 of the wire rod of the obliquely wound spring SCS with respect to the tangential direction T3 is smaller than the inclination angle θ1. At this time, the width of the obliquely wound spring SCS in the direction T2 at the contact point of the sphere 93 is D2, which is smaller than D1.

In the obliquely wound spring SCS, as the inclination angle θ2 becomes smaller with respect to the inclination angle θ1, the spring reaction force becomes larger. Therefore, in the obliquely wound spring SCS, the magnitude of the spring reaction force may be adjusted by adjusting the inclination angle θ1 and the inclination angle θ2. Further, the contact resistance between the obliquely wound spring SCS and the sphere 93 can be changed by a value obtained by dividing the width D2 by the width D1, that is, the crush ratio (D2/D1). For example, as the crush ratio (D2/D1) is smaller, the contact area between the obliquely wound spring SCS and the sphere 93 becomes larger, and the contact resistance between the obliquely wound spring SCS and the sphere 93 becomes smaller. The ratio (D2/D1) of the obliquely wound spring SCS is adjusted within a range of, for example, 75% or more such that the wire rods do not contact each other.

Figure 16:
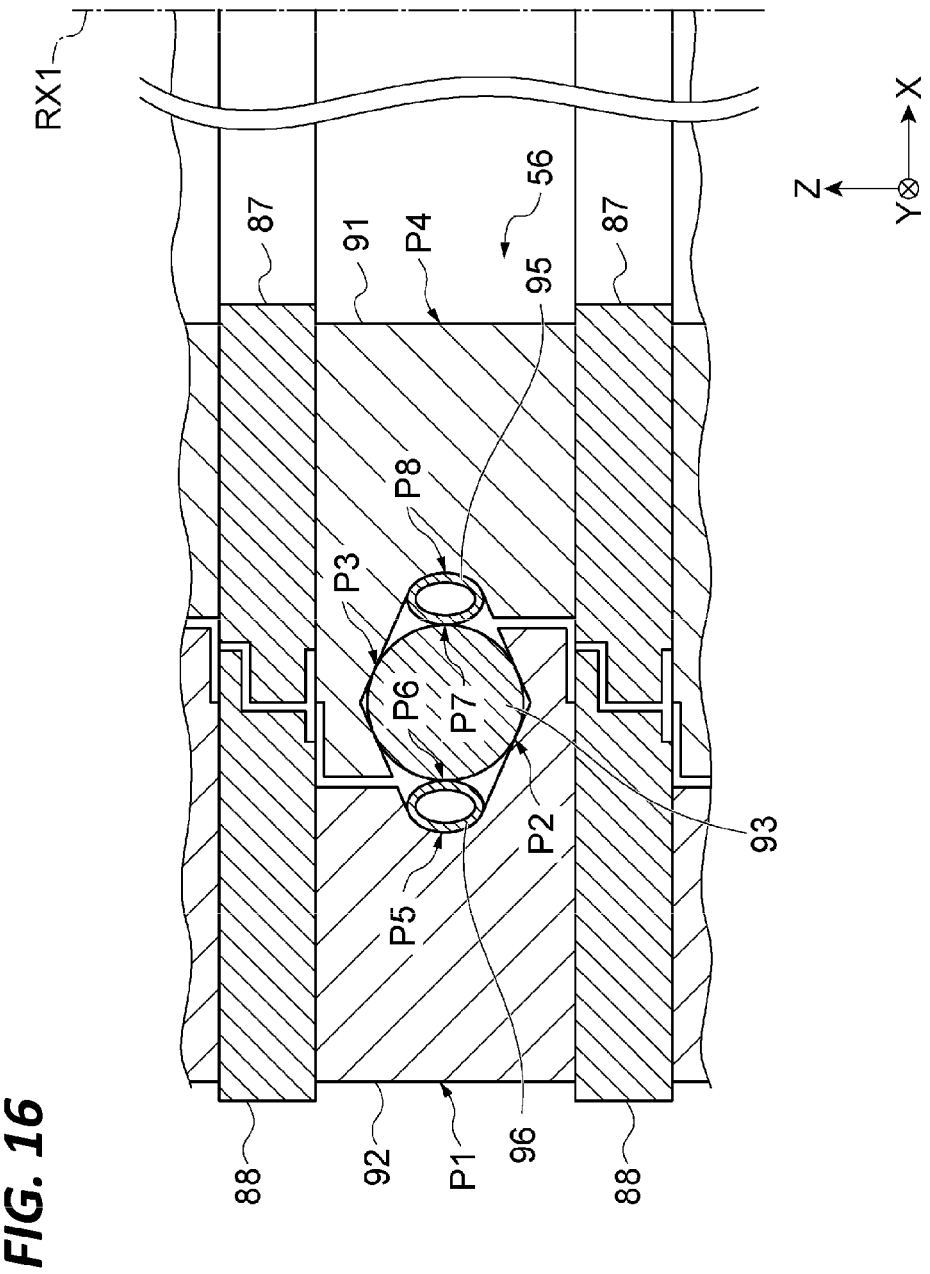
FIG. 16 is a view illustrating a point where a contact resistance occurs in a slip ring according to an exemplary embodiment.

Hereinafter, a combined resistance value of the contact resistance of the slip ring 56 will be described. FIG. 16 is a view illustrating a point where a contact resistance occurs in a slip ring according to an exemplary embodiment. As illustrated in FIG. 16, in the slip ring 56, contact resistance occurs at a contact point P1 between the wire extending from the outside of the processing container 12 and the stator 92, a contact point P2 between the stator 92 and the sphere 93, a contact point P3 between the sphere 93 and the rotor 91, a contact point P4 between the rotor 91 and a wire extending from the corresponding conductor of the conductor part 36A, a contact point P5 between the stator 92 and the coil spring 96, a contact point P6 between the sphere 93 and the coil spring 96, a contact point P7 between the sphere 93 and the coil spring 95, and a contact point P8 between the coil spring 95 and the rotor 91. Hereinafter, the contact resistance values at the contact point P1, the contact point P2, the contact point P3, the contact point P4, the contact point P5, the contact point P6, the contact point P7, and the contact point P8 are denoted as R1, R2, R3, R4, R5, R6, R7, and R8, respectively.

Figure 17A:
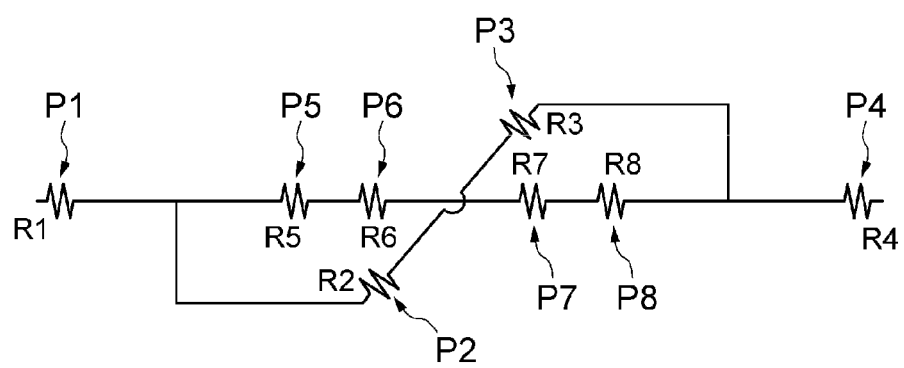
FIGS. 17A and 17B are views illustrating an equivalent circuit of a slip ring considering only a contact resistance.
Figure 17B:
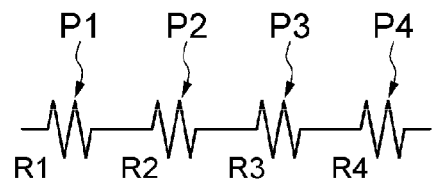

An equivalent circuit of the slip ring 56 considering only the contact resistance is illustrated in FIGS. 17A and 17B. FIG. 17A illustrates an equivalent circuit of the slip ring 56 considering only the contact resistance. FIG. 17B illustrates an equivalent circuit of the slip ring 56 when the coil spring 95 and the coil spring 96 are not present. As illustrated in FIG. 17A, in the equivalent circuit of the slip ring 56 considering only the contact resistance, two electrical paths exist between the contact resistance at the contact point P1 and the contact resistance at the contact point P4. Among the two electrical paths, the first path is a path including the contact resistance of the contact point P2 and the contact resistance of the contact point P3. That is, the first pass is a series path of the contact resistance of the stator 92 and the sphere 93 and the contact resistance of the sphere 93 and the rotor 91, which does not include the contact resistance caused by the coil spring 95 and the coil spring 96. Further, among the two electrical paths, the second path is a path including the contact point P5, the contact point P6, the contact point P7, and the contact point P8. That is, the second pass is a series path including the contact resistance caused by the coil spring 95 and the coil spring 96.

In the slip ring which does not have the coil spring 95 and the coil spring 96, there is no second path, and only the first path exists, as illustrated in FIG. 17B. Therefore, the combined resistance value R01 of the contact resistance of the slip ring which does not have the coil spring 95 and the coil spring 96 is as expressed by Equation (1).

$$R01 = R1 + RA + R4 \tag{1}$$

Here, RA is R2+R3.

The contact at the contact point P2 and the contact point P3 is point contact, and RA is very large. Further, when the number of the spheres 93 is n, the combined resistance value R01 is expressed by Equation (1a). However, since the number of the point contacts at the contact point P2 and the contact point P3 is very small, the combined resistance value R01 cannot be reduced. Therefore, the resistance value of the slip ring which does not have the coil spring 95 and the coil spring 96 becomes large.

$$R01 = R1 + RA/n + R4 \tag{1a}$$

Meanwhile, as illustrated in FIG. 17A, in the slip ring 56 having the coil spring 95 and the coil spring 96, the second path is connected in parallel between the contact resistance of the contact point P1 and the contact resistance of the contact point P4. A combined resistance value RB of the second path in the slip ring 56 is as expressed by Equation (2).

$$RB = R5 + R6 + R7 + R8 \tag{2}$$

The contact resistance value R5, the contact resistance value R6, the contact resistance value R7, and the contact resistance value R8 in the equation (2) are very small values because they are contact resistance values obtained from a number of contact points provided by the coil spring. In addition, the contact resistance value R5, the contact resistance value R6, the contact resistance value R7, and the contact resistance value R8 are stable. Further, the combined resistance value of the contact resistance of the slip ring 56 having the plurality of spheres 93 is as expressed by Equation (3).

$$R03 = R1 + 1/(1/(RA/n) + 1/(RB/n)) + R4 \tag{3}$$

As can be seen from Equation (3), the combined resistance value of the contact resistance of the slip ring 56 having the coil spring 95 and the coil spring 96 becomes extremely small. An exemplary slip ring 56 having 21 spheres 93 was prepared, and it was confirmed that a combined resistance value as small as 2.6 mΩ may be obtained as the combined resistance value R03 of Equation (3).

Therefore, in the plasma processing apparatus 10 having the slip rings 56 A to 56 E having the same configuration as that of the slip ring 56, it is possible to apply a DC voltage of 3,000 V or a DC voltage of minus several thousand volts for slow discharge to the electrode film 32a of the electrostatic chuck 32. Further, it is also possible to supply an AC power of, for example, 200 V and 20 A to 60 A from the heater power source 28 to the heater 28b. In addition, it is possible to supply a large bias to the lower electrode 34.

In addition, since the signal of the temperature sensor 34c is a voltage signal of a small level, it is easily affected by resistance, and in general, a signal from the temperature sensor 34c is taken out to the outside of the processing container 12 by the bridge circuit. However, in the plasma processing apparatus 10, a signal from the temperature sensor 34c may be taken out to the outside of the processing container 12 via an electrical path having a small resistance value without using a bridge circuit.

Figure 18A:
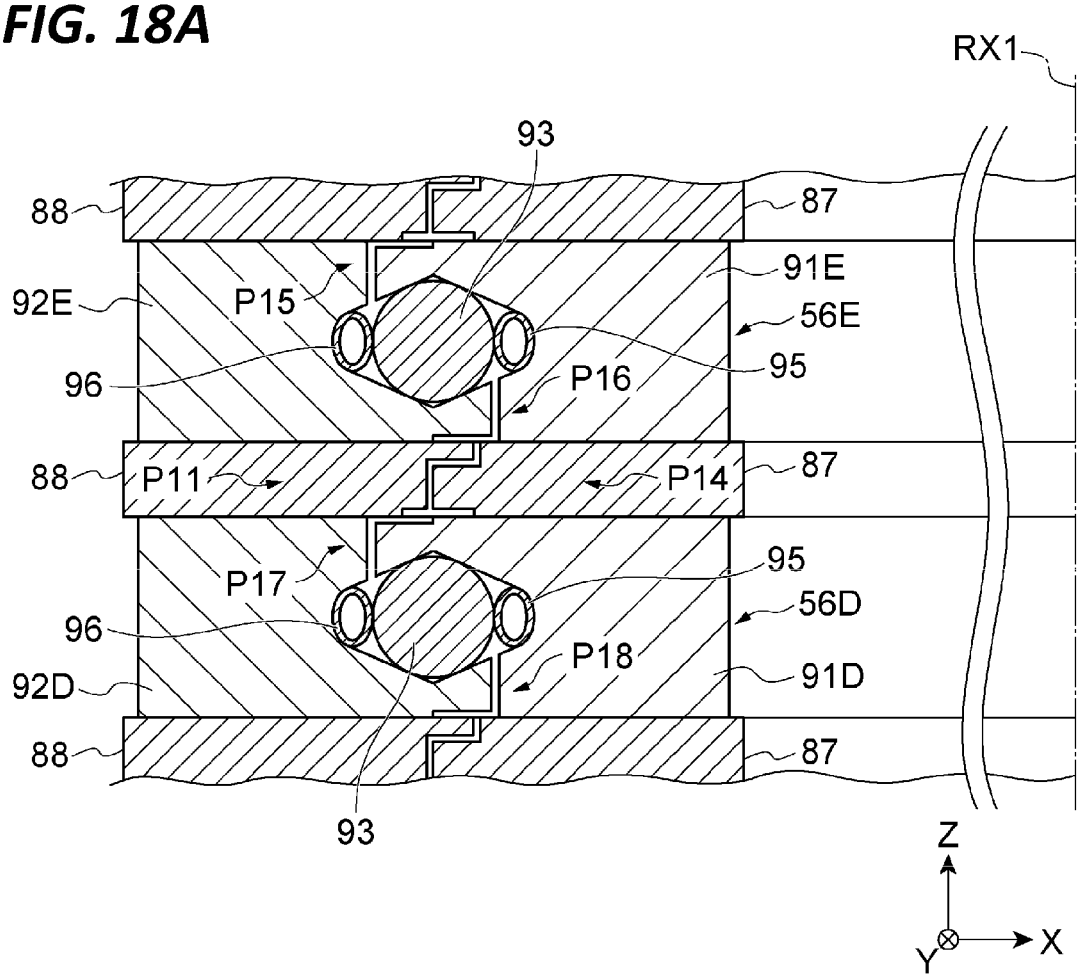
FIGS. 18A and 18B are views for explaining a high frequency characteristic of a rotary connector according to an exemplary embodiment.
Figure 18B:
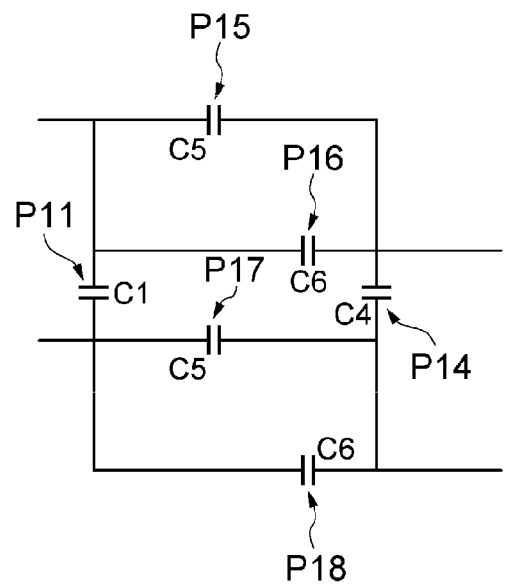

Hereinafter, the high frequency characteristics of the rotary connector 54 will be described. FIGS. 18A and 18B are views for explaining a high frequency characteristic of a rotary connector according to an exemplary embodiment. FIG. 18A illustrates a point where the capacitance occurs in the rotary connector, and FIG. 18B illustrates a circuit considering only the capacitance.

As illustrated in FIG. 18A, the slip ring 56E is an electrical path for supplying a high frequency bias as described above. This slip ring 56E, the above-described slip ring 56E, the isolator 87, and the isolator 88 generate capacitances that affect high frequencies. Specifically, a portion P11 including the stator 92E of the slip ring 56E, the stator 92D of the slip ring 56D, and the isolator 88 provided between the stator 92E and the stator 92D is a capacitor having a capacitance C1. Further, a point P14 including the rotor 91E of the slip ring 56E, the rotor 91D of the slip ring 56D, and the isolator 87 provided between the rotor 91E and the rotor 91D is a capacitor having a capacitance C4. Further, a point P15 including the stator 92E and the rotor 91E is a capacitor having a capacitance C5, and a point P16 including the stator 92E and the rotor 91E is a capacitor having a capacitance C6. Further, a point P17 including the stator 92D and the rotor 91D is a capacitor having a capacitance C5, and a point P18 including the stator 92D and the rotor 91D is a capacitor having a capacitance C6.

Figure 19:
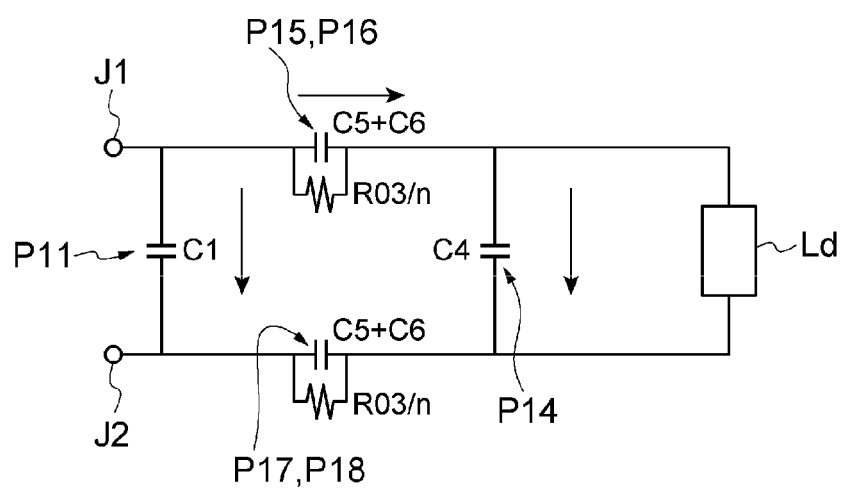
FIG. 19 is a view illustrating an equivalent circuit for a high frequency of a rotary connector according to an exemplary embodiment.

FIG. 19 is a view illustrating an equivalent circuit for a high frequency of a rotary connector according to an exemplary embodiment. The capacitor described with reference to FIGS. 18A and 18B and the combined resistance of the contact resistance described above constitute the equivalent circuit illustrated in FIG. 19 with respect to the high frequency. In this equivalent circuit, the capacitor at the point P11 is connected between the terminal J1 and the terminal J2, and the capacitor at the point P15, the capacitor at the point P16, the capacitor at the point P14, the capacitor at the point P17, and the capacitor at the point P18 are connected in parallel to the capacitor at point P11. The capacitor at the point P15 and the capacitor at the point P16 are provided in parallel, and the combined resistance of the combined resistance value R03/n is connected in parallel to the capacitor at the point P15 and the capacitor at the point P16. The capacitor at the point P17 and the capacitor at the point P18 are provided in parallel, and the combined resistance of the combined resistance value R03/n is connected in parallel to the capacitor at the point P17 and the capacitor at the point P18. Further, a load Ld for a high frequency such as a load generated in the processing container 12 is connected in parallel to the capacitor at the point P14.

The capacitance C5 and the capacitance C6 are small capacitances as they are caused by the narrow gap between the rotor and the stator. Meanwhile, the capacitance C1 and the capacitance C4 are large capacitances because the isolator 87 and the isolator 88 are made of, for example, polytetrafluoroethylene. Therefore, it is possible to reduce the current shunted from the terminal J1 to the capacitor at the point P11 and the capacitor at the point P14, and to efficiently supply the high frequency to the load Ld.

For example, the capacitance between the terminals J1 and J2 may be adjusted to 46 pF by the rotary connector 54. The capacitance of 46 pF has an impedance of 255 Ω for a high frequency of 13.56 MHz. Therefore, when the impedance of the load Ld is set to 1 Ω, 1/255 of the current supplied to the terminal J1 is shunted to the capacitor at the point P11 and the capacitor at the point P14. As described above, loss of high frequency may be suppressed by the rotary connector 54.

The capacitance C1 and the capacitance C4 depend on the thicknesses of the isolator 87 and the isolator 88. For example, the capacitance C1 and the capacitance C4 may be increased by increasing the thicknesses of the isolator 87 and the isolator 88. However, as the thicknesses of the isolator 87 and the isolator 88 increase, the size of the rotary connector 54 is increased. Therefore, the thicknesses of the isolator 87 and the isolator 88 may be set within the allowable size range of the rotary connector 54.

Further, in the rotary connector 54, it is required to prevent dielectric breakdown and creeping discharge between a plurality of slip rings. The material and the thickness of the isolator 87 and the isolator 88 also affect the dielectric breakdown and creeping discharge as described above. Therefore, the material and the thickness of the isolator 87 and the isolator 88 are selected so as to prevent dielectric breakdown and creeping discharge. Polytetrafluoroethylene has a DC withstand voltage of 20 kV/mm, for example, has a DC creeping discharge withstand voltage of 2 kV/mm, and is excellent as a material for the isolator 87 and the isolator 88. As such a material that may be adopted as a material for the isolator 87 and the isolator 88, polyether ether ketone (PEEK) is also exemplified.

Figure 20:
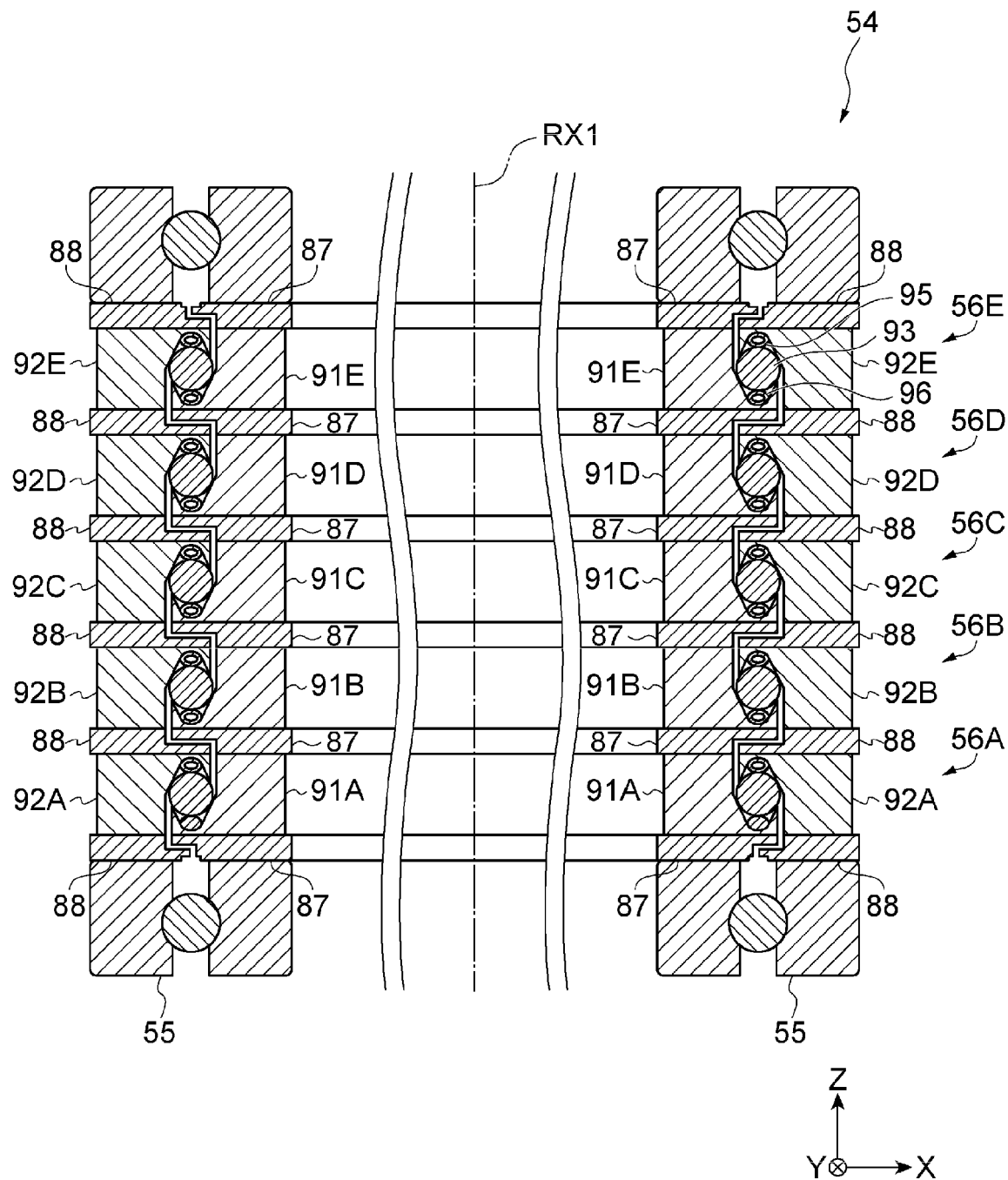
FIG. 20 is a cross-sectional view of a rotary connector according to another exemplary embodiment.

As such, various exemplary embodiments have been described, but various modifications may be made without being limited to the exemplary embodiments described above. For example, the arrangement of the coil spring 95 and the coil spring 96 is not limited to the radial arrangement. For example, the arrangement of the coil spring 95 and the coil spring 96 may be an axial arrangement as illustrated in FIG. 20. Specifically, in the rotary connector 54 illustrated in FIG. 20, the coil spring 95 and the coil spring 96 are arranged in a direction where the rotation axis RX1 extends.

In the slip ring adopting the radial arrangement, as illustrated in FIG. 9, the slip amount between the coil spring 95, which is provided closer to the rotation axis RX1 than the coil spring 96, and the plurality of spheres 93 is larger than the slip amount between the coil spring 96 and the plurality of spheres 93. Therefore, the abrasion of the coil spring 95 is larger than the abrasion of the coil spring 96.

Meanwhile, as illustrated in FIG. 20, in the slip ring adopting the axial arrangement, the distances from the rotational axis RX1 of the coil spring 95 and the coil spring 96 are substantially the same. Therefore, the slip amount between the coil spring 95 and the plurality of spheres 93 and the slip amount between the coil spring 96 and the plurality of spheres 93 become substantially equal to each other and become smaller. Therefore, abrasion of the coil spring 95 and the coil spring 96 is reduced, and the life of the slip ring is prolonged.

In the slip ring of the above-described exemplary embodiment, the rotor is provided inside the stator. That is, the inner ring is a rotor, and the outer ring is a stator. However, the inner ring may be a stator, and the outer ring may be a rotor.

Further, although the above-described plasma processing apparatus 10 is an inductively coupled plasma processing apparatus, the idea disclosed in this specification may be applied to any plasma processing apparatus such as a capacitively coupled plasma processing apparatus or a plasma processing using surface waves such as microwaves.

DESCRIPTION OF SYMBOLS

10: plasma processing apparatus, 12: processing container, 14: gas supply system, 14a: first gas supply unit, 14b: second gas supply unit, 16: plasma source, 18: support mechanism, 20: exhaust system, 20b: turbo molecular pump, 22: bias power source supply unit, 22a: first power source, 22b: second power source, 24: driving device, 26: rectifying member, 27: DC power source, 28: heater power source, 30: holding part, 32: electrostatic chuck, 32b: heater, 34: lower electrode, 34c: temperature sensor, 34f: coolant flow path, 36: rotary shaft part, 36A: conductor part, 36a, 36b, 36c, 36d, 36e: conductor, 40: container part, 50: tilting shaft part, 52: magnetic fluid seal part, 54: rotary connector, 57a, 57b, 57c, 57d, 57e: wire, 56, 56A, 56B, 56C, 56D, 56E: slip ring, 66: pipe, 70: rotary joint, 72: pipe, 74: pipe, 76: chiller unit, 78: driving device, 80: pulley, 82: conduction belt, 91, 91A, 91B, 91C, 91D, 91E: rotor, 92, 92A, 92B, 92C, 92D, 92E: stator, 93: sphere, 95: coil spring, 96: coil spring, 150A, 150B: high frequency power source, AX1: first axis, AX2: second axis, Cnt: controller, W: wafer

What is claimed is:

1. A slip ring comprising:
   a conductive rotor that is rotatable around a rotation axis;
   a conductive stator provided coaxially with the rotor;
   a plurality of conductive spheres disposed between the rotor and the stator to form an electric path between the rotor and the stator;
   a conductive coil spring provided between the plurality of conductive spheres and one of the rotor and the stator and extending in a circumferential direction with respect to the rotation axis to be in contact with the plurality of conductive spheres and one of the rotor and the stator, and
   a second conductive coil spring provided between the plurality of conductive spheres and a remaining one of the rotor and the stator and extending in a circumferential direction with respect to the rotation axis to be in contact with the plurality of conductive spheres and the remaining one of the rotor and the stator,
   wherein the electric path includes multiple point contacts between the coil spring and one of the rotor and the stator, multiple point contacts between the plurality of conductive spheres and the coil spring, multiple point contacts between the plurality of conductive spheres and the second coil spring, and multiple point contacts between the second coil spring and the remaining one of the rotor and the stator.

2. The slip ring of claim 1, wherein the coil spring and the second coil spring are arranged in a direction in which the rotation axis extends.

3. The slip ring of claim 1, wherein the coil spring and the second coil spring are arranged in a radial direction with respect to the rotation axis.

4. The slip ring of claim 1, wherein the coil spring is an obliquely wound spring.

5. The slip ring of claim 1, wherein the coil spring and the second coil spring are obliquely wound springs.

6. The slip ring of claim 1, wherein a pressure from the rotor and the stator to the plurality of conductive spheres is set such that a spinning force of the plurality of conductive spheres exceeds a frictional force between the plurality of conductive spheres and the coil spring and a frictional force between the plurality of conductive spheres and the second coil spring.

7. A support mechanism for supporting a workpiece in a processing container of a plasma processing apparatus, the mechanism comprising:
   a holding part that holds the workpiece and is rotatable around a first axis;
   a driving device that rotates the holding part; and
   a rotary connector having a plurality of slip rings provided such that a rotation axis thereof coincides with the first axis, each of the slip rings being the slip ring according to claim 1,
   wherein the holding part includes a lower electrode; an electrostatic chuck provided on the lower electrode; and a plurality of conductors coaxially provided such that center axes thereof coincide with the first axis, and including a first conductor connected to an electrode film of the electrostatic chuck and a second conductor connected to the lower electrode, and
   among the plurality of slip rings, a first slip ring is electrically connected to the first conductor and a second slip ring is electrically connected to the second conductor.

8. The support mechanism of claim 7, further comprising:
   a container part that defines a sealed space together with the holding part;
   a hollow tilting shaft part that is coupled to the container part and extends along a second axis orthogonal to the first axis; and
   a second driving device that rotates the tilting shaft part around the second axis,
   wherein the plurality of conductors, the driving device that rotates the holding part, and the rotary connector are provided in the space.

9. A plasma processing apparatus for performing a plasma processing on a workpiece, the apparatus comprising:
   a processing container;
   a gas supply system that supplies a gas into the processing container;
   a plasma source that excites the gas supplied into the processing container;
   the support mechanism of claim 7 that holds the workpiece in the processing container by the holding part;
   an exhaust system that exhausts a space in the processing container;
   a DC power source that is provided outside the processing container and generates a voltage to be applied to the electrode film of the electrostatic chuck; and
   a bias power supply unit that is provided outside the processing container and generates a bias to be applied to a lower electrode,
   wherein the DC power source is connected to a first slip ring via a first wire, and
   the bias power supply unit is connected to a second slip ring via a second wire.

10. The plasma processing apparatus of claim 9, wherein the support mechanism is the support mechanism of claim 8,
   the holding part and the container part are provided within the processing container,
   the tilting shaft part is provided to extend from an inside of the processing container to an outside of the processing container,
   the first wire passes through the tilting shaft part and connects the DC power source and the first slip ring to each other, and the second wire passes through the tilting shaft part and connects the bias power supply unit and the second slip ring to each other.

11. The plasma processing apparatus of claim 10, wherein the holding part further includes a heater, the plurality of conductor further includes third and fourth conductors that are connected to the heater, the plurality of slip rings further includes a third slip ring connected to the third conductor and a fourth slip ring connected to the fourth conductor, the plasma processing apparatus further comprises a heater power source that is provided outside the processing container and supplies a power to the heater, and the heater power source is electrically connected to the third slip ring and the fourth slip ring via third and fourth wires that pass through the tilting shaft part, respectively.

12. The plasma processing apparatus of claim 11, wherein the support mechanism further includes a temperature sensor provided in the holding part, the plurality of conductors further includes a fifth conductor connected to the temperature sensor, the plurality of slip rings further includes a fifth slip ring connected to the fifth conductor, the plasma processing apparatus further comprises a controller, and the controller is electrically connected to the fifth slip ring via a fifth wire that passes through an inside of the tilting shaft part.

13. The plasma processing apparatus of claim 9, wherein the bias power supply unit supplies a pulse-modulated DC voltage to the lower electrode.

14. The plasma processing apparatus of claim 13, wherein the bias power supply unit selectively supplies the pulse-modulated DC voltage and a high-frequency bias to the lower electrode.

15. A slip ring comprising:
a conductive rotor that is rotatable around a rotation axis;
a conductive stator provided coaxially with the rotor;
a plurality of conductive spheres disposed between the rotor and the stator to form an electric path between the rotor and the stator;
a plurality of insulating retainers disposed adjacent to the plurality of conductive spheres, respectively and configured to separate a conductive sphere from another conductive sphere along a circumferential direction with respect to the rotation axis;
a conductive coil spring provided between the plurality of conductive spheres and one of the rotor and the stator and extending in the circumferential direction with respect to the rotation axis to be in contact with the plurality of conductive spheres and one of the rotor and the stator; and
a second conductive coil spring provided between the plurality of conductive spheres and a remaining one of the rotor and the stator and extending in a circumferential direction with respect to the rotation axis to be in contact with the plurality of conductive spheres and the remaining one of the rotor and the stator,
wherein the electric path includes multiple point contacts between the coil spring and one of the rotor and the stator, multiple point contacts between the plurality of conductive spheres and the coil spring, multiple point contacts between the plurality of conductive spheres and the second coil spring, and multiple point contacts between the second coil spring and the remaining one of the rotor and the stator.

* * * * *